(12) United States Patent
Ka et al.

(10) Patent No.: US 11,557,520 B2
(45) Date of Patent: Jan. 17, 2023

(54) DISPLAY DEVICE INCLUDING A TEST UNIT

(71) Applicant: Samsung Display Co., Ltd., Yongin-si (KR)

(72) Inventors: Jihyun Ka, Asan-si (KR); Wonkyu Kwak, Seongnam-si (KR); Hansung Bae, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 26 days.

(21) Appl. No.: 17/101,189

(22) Filed: Nov. 23, 2020

(65) Prior Publication Data

US 2021/0074597 A1 Mar. 11, 2021

Related U.S. Application Data

(63) Continuation of application No. 15/693,567, filed on Sep. 1, 2017, now Pat. No. 10,847,432.

(30) Foreign Application Priority Data

Sep. 12, 2016 (KR) ........................ 10-2016-0117272

(51) Int. Cl.
*H01L 21/66* (2006.01)
*H01L 27/32* (2006.01)
(Continued)

(52) U.S. Cl.
CPC ............ *H01L 22/34* (2013.01); *H01L 27/124* (2013.01); *H01L 27/1225* (2013.01);
(Continued)

(58) Field of Classification Search
CPC ... H01L 22/34; H01L 27/1225; H01L 27/124; H01L 27/3223; H01L 27/3244;
(Continued)

(56) References Cited

U.S. PATENT DOCUMENTS 8,581,257 B2 11/2013 Murai et al.
8,803,206 B1 8/2014 Or-Bach et al.
(Continued)

FOREIGN PATENT DOCUMENTS

KR 10-2011-0039773 4/2011
KR 10-2013-0012069 1/2013
(Continued)

OTHER PUBLICATIONS

Extended European Search Report dated Feb. 12, 2018, of the corresponding European Patent Application No. 17190682.9.

*Primary Examiner* — Lawrence C Tynes, Jr.
(74) *Attorney, Agent, or Firm* — Kile Park Reed & Houtteman PLLC

(57) ABSTRACT

A display device includes a pixel connected to a data line, a data pad connected to the data line, and a first test area. The first test area includes a test control line transmitting a test control signal, a test signal line transmitting a test signal, and a first switch connected to the data pad. The first switch includes a gate electrode connected to the test control line, first and second semiconductor layers overlapping the gate electrode, a source electrode connected to the first and second semiconductor layers, and a drain electrode spaced from the source electrode and connected to the first and second semiconductor layers. The source electrode and the drain electrode are connected to the test signal line and data pad, respectively. One of the first or second semiconductor layers includes an oxide semiconductor and the other of the first or second semiconductor layer includes a silicon-based semiconductor.

20 Claims, 17 Drawing Sheets

(51) Int. Cl.
*H01L 27/12* (2006.01)
*H01L 29/417* (2006.01)
*H01L 29/24* (2006.01)
*H01L 29/786* (2006.01)
*G02F 1/1362* (2006.01)
*G02F 1/1368* (2006.01)

(52) U.S. Cl.
CPC ...... *H01L 27/1251* (2013.01); *H01L 27/3262* (2013.01); *H01L 29/24* (2013.01); *H01L 29/41733* (2013.01); *H01L 29/7869* (2013.01); *H01L 29/78648* (2013.01); *H01L 29/78672* (2013.01); *H01L 29/78696* (2013.01); *G02F 1/1368* (2013.01); *G02F 1/136254* (2021.01); *G02F 2201/123* (2013.01); *G02F 2202/105* (2013.01); *H01L 27/3223* (2013.01); *H01L 27/3244* (2013.01)

(58) Field of Classification Search
CPC ..... H01L 27/12; H01L 27/1251; H01L 29/24; H01L 29/78648; H01L 29/78672; H01L 29/7869; H01L 29/78696; H01L 29/786; H01L 29/41733; H01L 21/66; G02F 1/1368; G02F 2001/13625; G02F 2201/123; G02F 2202/105
See application file for complete search history.

(56) References Cited

U.S. PATENT DOCUMENTS

| | | | |
|---|---|---|---|
| 10,847,432 B2* | 11/2020 | Ka | H01L 27/1225 |
| 2006/0267100 A1* | 11/2006 | Noguchi | H01L 29/66772 |
| | | | 257/351 |
| 2008/0129327 A1* | 6/2008 | Kim | G09G 3/006 |
| | | | 324/750.3 |
| 2011/0084955 A1 | 4/2011 | Kim | |
| 2012/0018808 A1* | 1/2012 | Isobe | H01L 27/0688 |
| | | | 257/347 |
| 2013/0240886 A1* | 9/2013 | Yeh | H01L 27/1251 |
| | | | 257/57 |
| 2014/0246670 A1 | 9/2014 | Koyama | |
| 2014/0291669 A1* | 10/2014 | Ji | H01L 29/78696 |
| | | | 257/43 |
| 2015/0214245 A1 | 7/2015 | Kim et al. | |
| 2016/0079285 A1 | 3/2016 | Chiang et al. | |
| 2016/0163870 A1 | 6/2016 | Ito et al. | |
| 2016/0240565 A1 | 8/2016 | Kim et al. | |
| 2016/0247934 A1 | 8/2016 | Hanaoka | |

FOREIGN PATENT DOCUMENTS

| | | |
|---|---|---|
| KR | 10-2014-0082844 | 7/2014 |
| KR | 10-2016-0053239 | 5/2016 |

* cited by examiner

DISPLAY DEVICE INCLUDING A TEST UNIT

CROSS-REFERENCE TO RELATED APPLICATION(S)

This is a continuation application of U.S. patent application Ser. No. 15/693,567 filed Sep. 1, 2017 (now issued as U.S. Pat. No. 10,847,432), the disclosure of which is incorporated herein by reference in its entirety. U.S. patent application Ser. No. 15/693,567 claims priority benefit of Korean Patent Application No. 10-2016-0117272 filed Sep. 12, 2016, in the Korean Intellectual Property Office, the disclosure of which is incorporated herein by reference in its entirety for all purposes.

BACKGROUND

1. Field

One or more embodiments described herein relate to a display device including a test unit.

2. Discussion of the Related Art

A variety of displays have been developed. Examples include liquid crystal displays and organic light emitting diode displays. These display devices may include a test unit for testing whether wirings or pixels are defective. The test unit may be in a non-display area. However, the size of the non-display area has become smaller with increasing display size.

SUMMARY

In accordance with one or more embodiments, a display device includes a substrate; a pixel portion on the substrate and including a pixel connected to a data line; a data pad connected to one end of the data line; and a first test area including a test control line to transmit a test control signal, a test signal line to transmit a test signal, and a first switch connected to the data pad, wherein the first switch includes: a gate electrode connected to the test control line, a first semiconductor layer and a second semiconductor layer overlapping the gate electrode; a source electrode connected to the first semiconductor layer and the second semiconductor layer, the source electrode connected to the test signal line; and a drain electrode spaced apart from the source electrode and connected to the first semiconductor layer and the second semiconductor layer, the drain electrode connected to the data pad, wherein one of the first semiconductor layer or the second semiconductor layer includes an oxide semiconductor and the other of the first semiconductor layer or the second semiconductor layer includes a silicon-based semiconductor.

The first semiconductor layer and the second semiconductor layer may be spaced from each other. The first semiconductor layer may at least partially overlaps the second semiconductor layer. The display device may include an insulating layer between the first semiconductor layer and the second semiconductor layer. Each of the source electrode and the drain electrode may be connected to at least one of the first semiconductor layer or the second semiconductor layer through a contact hole in the insulating layer.

The gate electrode may be between the first semiconductor layer and the second semiconductor layer. The silicon-based semiconductor may include crystalline silicon. The oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO). The gate electrode may include a first gate electrode and a second gate electrode that overlap each other and that are spaced apart from each other. At least one of the first gate electrode or the second gate electrode is between the first semiconductor layer and second semiconductor layer.

The first semiconductor layer and the second semiconductor layer may be between the first gate electrode and the second gate electrode. The first test area may detect resistive defects and short defects. The first test area may selectively perform a lighting test and a link line test.

The display device may include a second test area including a second switch connected to another end of the data line. The second test area may perform a lighting test. The pixel portion may include an organic light emitting diode.

The display device may include a thin film transistor connected to the organic light emitting diode, wherein the thin film transistor includes a gate electrode, a semiconductor layer, a source electrode, and a drain electrode, and wherein the source electrode and the drain electrode of the thin film transistor are on substantially a same layer as the source electrode and the drain electrode of the first switch. The gate electrode of the thin film transistor may be on substantially a same layer as layer the gate electrode of the first switch. The semiconductor layer of the thin film transistor may be on substantially a same layer as one of the first semiconductor layer or the second semiconductor layer of the first switch. The pixel portion may include a liquid crystal layer on the pixel electrode.

The display device may include a thin film transistor connected to the pixel electrode, wherein the thin film transistor includes a gate electrode, a semiconductor layer, a source electrode, and a drain electrode, and wherein the source electrode and the drain electrode of the thin film transistor are on substantially a same layer as the source electrode and the drain electrode of the first switch. The gate electrode of the thin film transistor may be on substantially a same layer as the gate electrode of the first switch. The semiconductor layer of the thin film transistor may be on substantially a same layer as one of the first or second semiconductor layers of the first switch.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
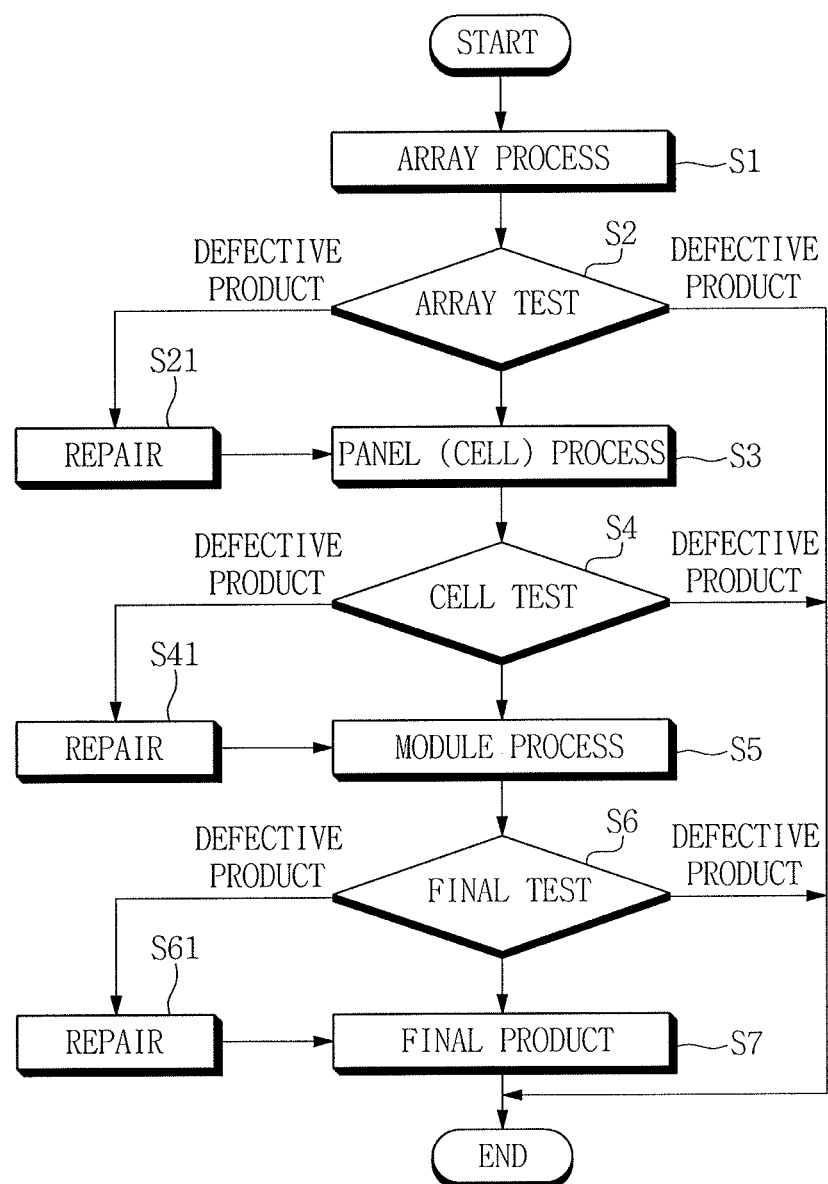
FIG. 1 illustrates an embodiment of a method for manufacturing a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a method for manufacturing a display device. According to this method, first, an array process S1 is performed to form a wiring portion on a substrate. The wiring portion may include a thin film transistor ("TFT"). Subsequently, an array test S2 is performed to detect whether or not the wiring portion is defective. The array test S2 may include determining whether or not the TFT normally operates. A substrate including a wiring portion determined to be defective in the array test S2 may be subject to a repair process S21. If the substrate including the wiring portion is determined to be unrepairable, then process flow does not continue to a next process, but is terminated.

A panel (cell) process S3 is performed for forming a panel by disposing an electrode and a display element on the wiring portion of the substrate that is determined to be substantially non-defective or has been repaired. Subsequently, a cell test S4 is performed on the panel. The cell test S4 may include at least one of a lighting test, a link line test, a leakage current test, or an aging test for the panel. When the panel is determined to be defective in the cell test S4, the panel is subject to a repair process S41. When the panel is determined to be unrepairable, process flow does not proceed to the next process, but is terminated.

A module process S5 is performed on a panel that has been determined to be substantially non-defective or has been repaired. A final test S6 is performed to determine whether the panel is a final product or a defective product. A module that is determined to be a defective product in final test S6 may be subject to a repair process S61, if possible. If the module is unrepairable, process flow is terminated. A final product S7 may correspond to a module that has been determined to be substantially non-defective or that has been repaired.

Figure 2:
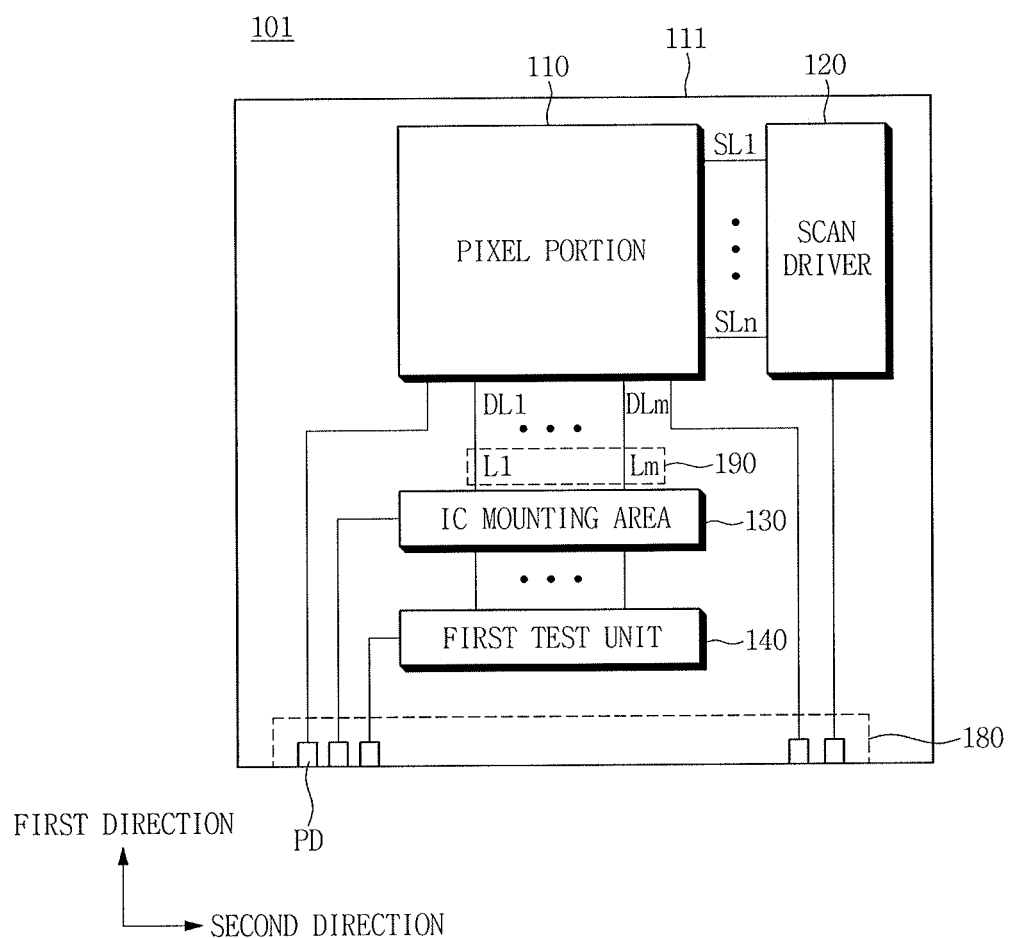
FIG. 2 illustrates an embodiment of a display device.
Figure 3A:
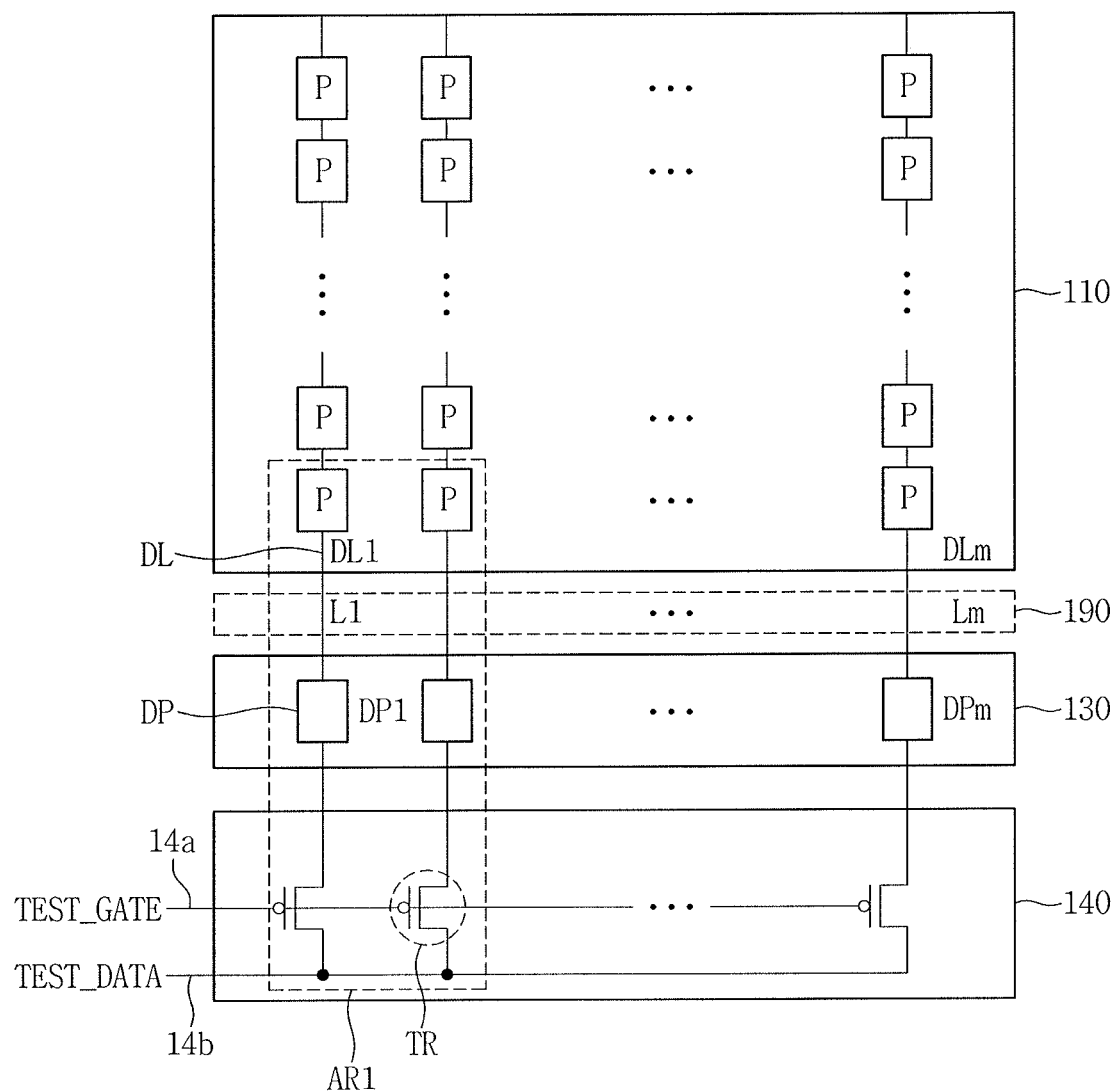
FIG. 3A illustrates wiring of the display device according to one embodiment.
Figure 3B:
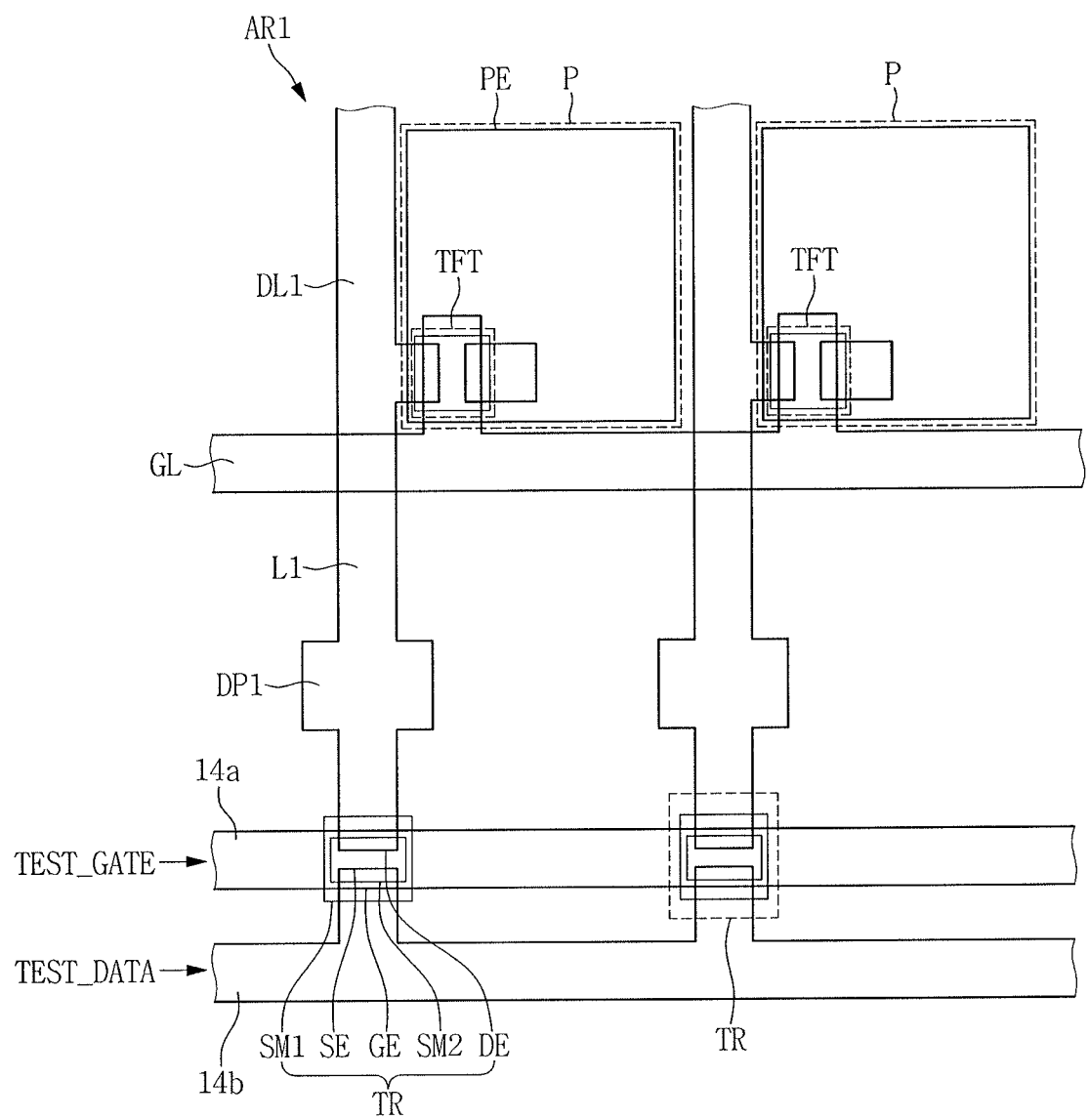
FIG. 3B illustrates an embodiment of area AR1 in FIG. 3A.

FIG. 2 illustrates an embodiment of a display device 101, FIG. 3A is a partial plan view illustrating an embodiment of a wiring of the display device 101, and FIG. 3B is a plan view illustrating an embodiment of area AR1 in FIG. 3A.

Referring to FIG. 2, the display device 101 includes a substrate 111, a pixel portion 110 on the substrate 111, a scan driver 120, an integrated circuit (IC) mounting area 130, a first test unit 140, and a pad unit 180. The pixel portion 110 includes data lines DL1 to DLm and scan lines SL1 to SLn that intersect one another, and a plurality of pixels P that emit light of different colors. The data lines DL1 to DLm extend in a first direction, and the scan lines SL1 to SLn extend in a second direction. The extending directions of the data lines DL1 to DLm and the scan lines SL1 to SLn may be different in another embodiment.

The scan driver 120 generates a scan signal based on a scan driving power and a scan control signal applied from an external source. The scan driver 120 sequentially applies the scan signals to the scan lines SL1 to SLn.

The IC mounting area 130 includes a plurality of data pads DP connected to first ends of the data lines DL1 to DLm of the pixel portion 110. A data driver 120 may be connected to the data pads DP1 to DPm, for example, by a chip-on-glass (COG) method. The data driver 120 may be in the IC mounting area 130 and generates data signals based on display data and a data control signal. The data signals are to applied to data lines DL1 to DLm.

The first test unit 140 applies a test signal to link lines L1 to Lm at a fan-out portion 190. The link lines L1 to Lm extend from the data lines DL1 to DLm of the pixel portion 110 to the IC mounting area 130. The test signal is applied to the data lines DL1 to DLm through the link lines L1 to Lm.

The first test unit 140 may detect predetermined defects (e.g., resistive defects and short defects) of the link lines L1 to Lm and the data lines DL1 to DLm at the fan-out portion 190. The resistive defect detection detects, for example, vertical line defects that may occur on the screen as the result of an increase in resistance due to cracks of the link lines L1 to Lm. The short defect detection detects, for example, a short circuit of the data lines DL1 to DLm or the link lines L1 to Lm. The first test unit 140 receives a test signal and a test control signal and applies the test signal to the data lines DL1 to DLm via the link lines L1 to Lm based on the test control signal.

The pad unit 180 includes a plurality of pads PD for transmitting power, signals, or both, received from at least one external source. The positions and/or numbers of lines connecting respective components of the pad unit 180 and the pixel portion 110 may be different in another embodiment.

The first test unit 140 includes switching elements TR between the data pads DP of the IC mounting area 130 and a test signal line 14b. The switching element TR is connected to a test control line 14a for applying a test control signal TEST_GATE and the test signal line 14b for applying a test signal TEST_DATA. The switching element TR is also connected to the data line DL through the data pad DP.

FIG. 3B illustrates an embodiment of area AR1 which corresponds to a part of the wiring in FIG. 3A. According to an exemplary embodiment, the switching element TR includes a gate electrode GE, a first semiconductor layer SM1, a second semiconductor layer SM2, a source electrode SE, and a drain electrode DE.

Referring to FIGS. 3A and 3B, the switching element TR includes a gate electrode GE connected to the test control line 14a for applying the test control signal TEST_GATE, a source electrode SE connected to the test signal line 14b for applying the test signal TEST_DATA, and a drain electrode DE connected to the data pad DP. One data pad DP1 is connected to one data line DL1 through one link line L1. The first test unit 140, the IC mounting area 130, the data pad DP, the link lines L1 to Lm, and/or switching element TR may have different connections in another embodiment.

The luminance of pixels P connected to data line(s) DL that is/are connected to a link line having a resistive defect may be different from the luminance of pixels p in adjacent columns. Thus, wiring connected to a data line in a column that emits light with a higher or lower luminance than that of adjacent columns may be determined as having a resistive defect or a short circuit. In such an exemplary embodiment, whether the wiring has a resistive defect or a short circuit may be identified based on the degree of luminance difference with respect to the luminance of adjacent columns.

Figure 4A:
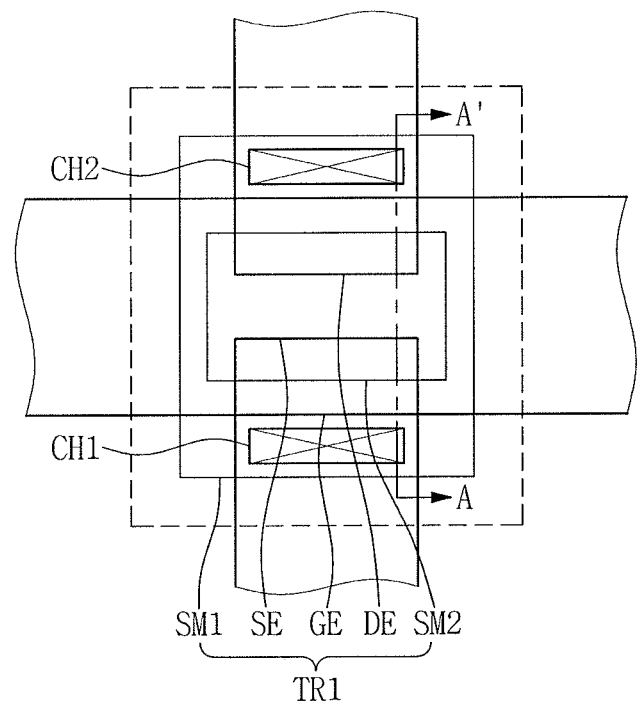
FIG. 4A illustrates an embodiment of a switching element.
Figure 4B:
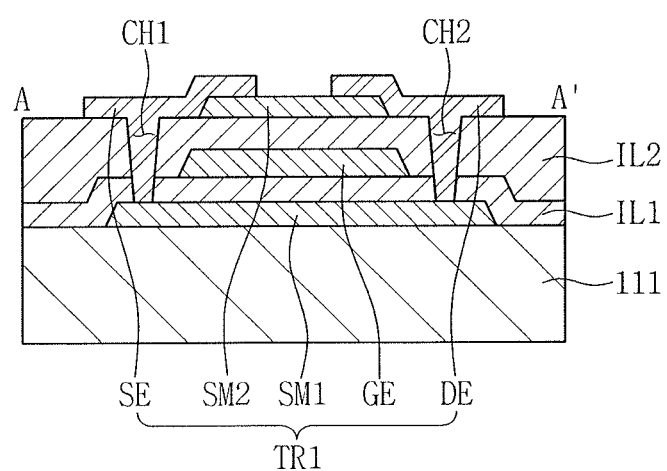
FIG. 4B illustrates a view taken along section line A-A' in FIG. 4A.

FIG. 4A illustrates an embodiment of a switching element TR1 at the first test unit 140, and FIG. 4B is a cross-sectional view taken along line A-A' of FIG. 4A. Referring to FIGS. 3B, 4A, and 4B, the switching element TR1 of the first test unit 140 is a TFT including a gate electrode GE, a first semiconductor layer SM1, a second semiconductor layer SM2, a source electrode SE, and a drain electrode DE.

The gate electrode GE of the switching element TR1 is connected to the test control line 14a. The first semiconductor layer SM1 and the second semiconductor layer SM2 overlap at least a portion of the gate electrode GE. The source electrode SE is connected to the first semiconductor layer SM1 and the second semiconductor layer SM2, and also to the test signal line 14b. The source electrode SE at least partially overlaps the first semiconductor layer SM1 and the second semiconductor layer SM2.

The drain electrode DE is spaced apart from the source electrode SE and is connected to the first semiconductor layer SM1 and the second semiconductor layer SM2, and also to the data pad DP. The drain electrode DE at least partially overlaps the first semiconductor layer SM1 and the second semiconductor layer SM2. The first semiconductor layer SM1 and the second semiconductor layer SM2 are spaced apart from each other. At least a portion of the first semiconductor layer SM1 overlaps the second semiconductor layer SM2.

Referring to FIG. 4B, insulating layers IL1 and IL2 are between the first semiconductor layer SM1 and the second semiconductor layer SM2. Each of the source electrode SE and the drain electrode DE directly contacts the second semiconductor layer SM2. The source electrode SE and the drain electrode DE are connected to the first semiconductor layer SM1, respectively, through contact holes CH1 and CH2 in the insulating layers IL1 and IL2.

Referring to FIG. 4B, the gate electrode GE is between the first semiconductor layer SM1 and the second semiconductor layer SM2. For example, a first insulating layer IL1 is between the first semiconductor layer SM1 and the gate electrode GE. A second insulating layer IL2 is between the gate electrode GE and the second semiconductor layer SM2. In such an exemplary embodiment, the first insulating layer IL1 may be referred to as a gate insulating layer.

One of the first semiconductor layer SM1 or the second semiconductor layer SM2 includes an oxide semiconductor. The other of the first semiconductor layer SM1 or the second semiconductor layer SM2 includes a silicon-based semiconductor. For example, the first semiconductor layer SM1 may include a silicon-based semiconductor. The second semiconductor layer SM2 may include an oxide semiconductor. Conversely, the first semiconductor layer SM1 may include an oxide semiconductor, and the second semiconductor layer SM2 may include a silicon-based semiconductor.

The silicon-based semiconductor may include crystalline silicon. For example, low-temperature polycrystalline silicon (LTPS) may be the silicon-based semiconductor. The silicon-based semiconductor has stable electrical characteristics.

Examples of the oxide semiconductor may include oxides based on zinc (Zn), indium (In), gallium (Ga), tin (Sn) and titanium (Ti), and alloy oxides thereof. For example, the oxide semiconductor may include or be formed of at least one material selected from the group consisting of: zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

Impurities may be implanted into the oxide semiconductor for forming the first semiconductor layer SM1 or second semiconductor layer SM2. A portion of the oxide semiconductor selectively implanted with the impurity may become a contact portion with the source electrode SE and the drain electrode DE. A portion of the oxide semiconductor not implanted with the impurity may become a channel area. The oxide semiconductor has advantages such as high electric field mobility, low threshold voltage, and low leakage current.

In one embodiment, the switching element TR1 may have both characteristics of a silicon-based semiconductor and characteristics of an oxide semiconductor, and thus may have excellent electrical characteristics and a high signal transmission rate. The switching element TR1 may therefore have excellent switching characteristics even though the semiconductor layers SM1 and SM2 have narrow width. Accordingly, the switching element TR1 may be arranged at a high density in a narrow area.

Figure 5A:
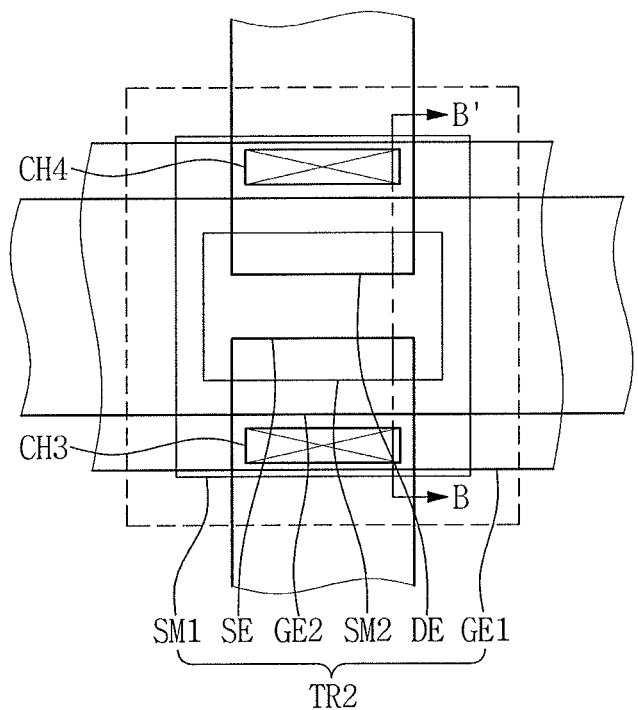
FIG. 5A illustrates another embodiment of a switching element.
Figure 5B:
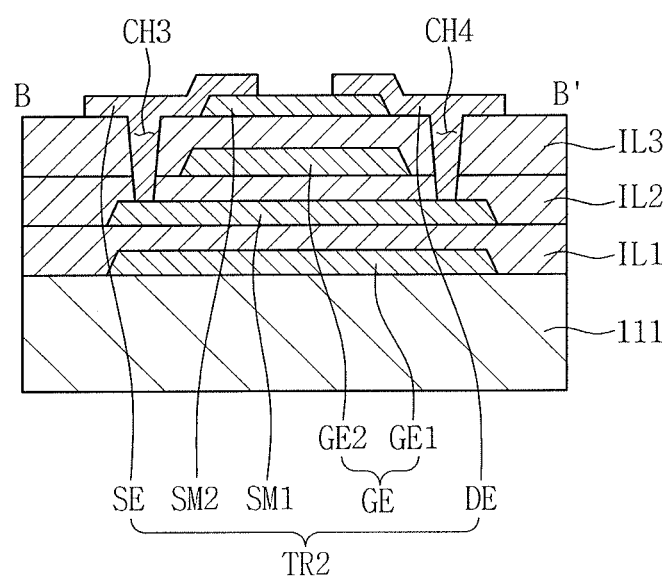
FIG. 5B illustrates a view taken along section line B-B' in FIG. 5A.

FIG. 5A illustrates an embodiment of a switching element TR2, and FIG. 5B illustrates a cross-sectional view taken along line B-B' of FIG. 5A. Referring to FIGS. 5A and 5B, a gate electrode GE includes a first gate electrode GE1 and a second gate electrode GE2. In such an exemplary embodiment, at least one of the first gate electrode GE1 or the second gate electrode GE2 may be between a first semiconductor layer SM1 and a second semiconductor layer SM2.

For example, the first gate electrode GE1 is on a substrate 111, a first insulating layer IL1 is on the first gate electrode GE1, the first semiconductor layer SM1 is on the first insulating layer IL1, a second insulating layer IL2 is on the first semiconductor layer SM1, the second gate electrode GE2 is on the second insulating layer IL2, a third insulating layer IL3 is on the second gate electrode GE2, the second semiconductor layer SM2 is on the third insulating layer IL3, and a source electrode SE and a drain electrode DE, each in contact with the second semiconductor layer SM2, are on the second semiconductor layer SM2. In such an exemplary embodiment, the source electrode SE and the drain electrode DE are connected to the first semiconductor layer SM1 through respective contact holes CH3 and CH4 through the second insulating layer IL2 and the third insulating layer IL3.

Figure 6A:
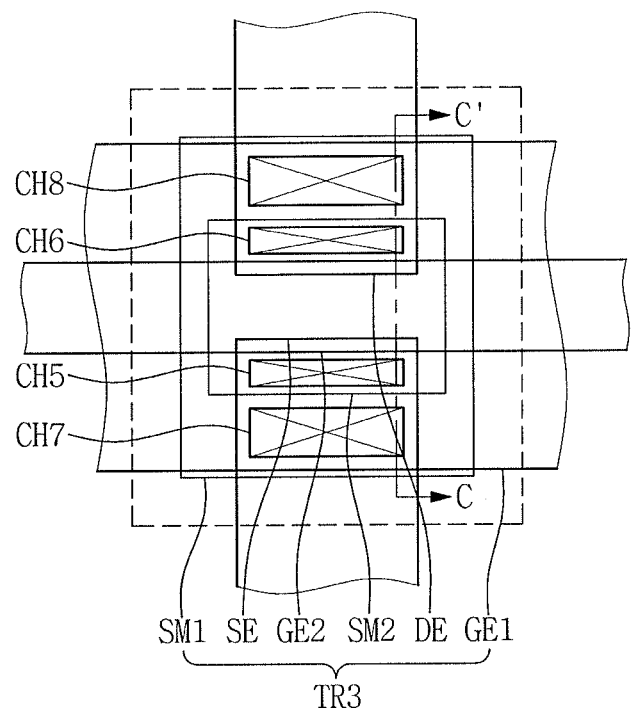
FIG. 6A illustrates another embodiment of a switching element.
Figure 6B:
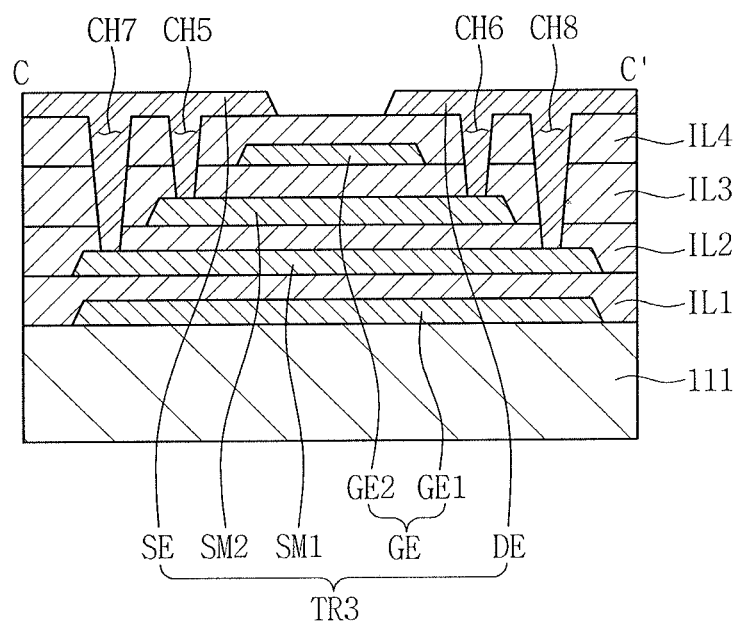
FIG. 6B illustrates a view taken along section line C-C' in FIG. 6A.

FIG. 6A illustrating an embodiment of switching element TR3, and FIG. 6B illustrates a cross-sectional view taken along line C-C' of FIG. 6A. Referring to FIGS. 6A and 6B, a gate electrode GE includes a first gate electrode GE1 and a second gate electrode GE2. A first semiconductor layer SM1 and a second semiconductor layer SM2 are between the first gate electrode GE1 and the second gate GE2.

For example, the first gate electrode GE1 is on a substrate 111, a first insulating layer IL1 is on the first gate electrode GE1, the first semiconductor layer SM1 is on the first insulating layer IL1, a second insulating layer IL2 is on the first semiconductor layer SM1, the second semiconductor layer SM2 is on the second insulating layer IL2, a third insulating layer IL3 is on the second semiconductor layer SM2, the second gate electrode GE2 is on the third insulating layer IL3, a fourth insulating layer IL4 is on the second gate electrode GE2, and a source electrode SE and a drain electrode DE are on the fourth insulating layer IL4. In such an exemplary embodiment, the source electrode SE and the drain electrode DE are connected to the second semiconductor layer SM2 through respective contact holes CH5 and CH6 through the fourth insulating layer IL4 and the third insulating layer IL3. The source electrode SE and the drain electrode DE are connected to the first semiconductor layer SM1 through respective contact holes CH7 and CH8 through the fourth insulating layer IL4, the third insulating layer IL3, and the second insulating layer IL2.

Figure 7A:
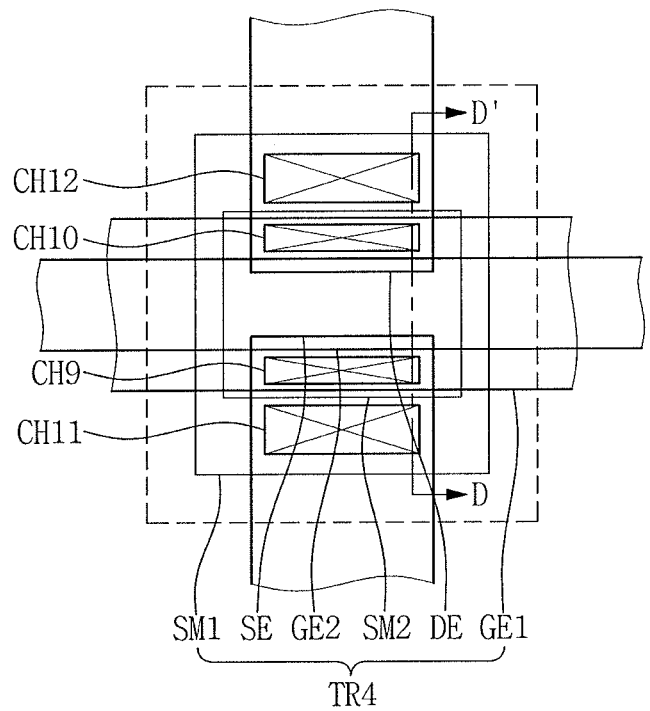
FIG. 7A illustrates another embodiment of a switching element.
Figure 7B:
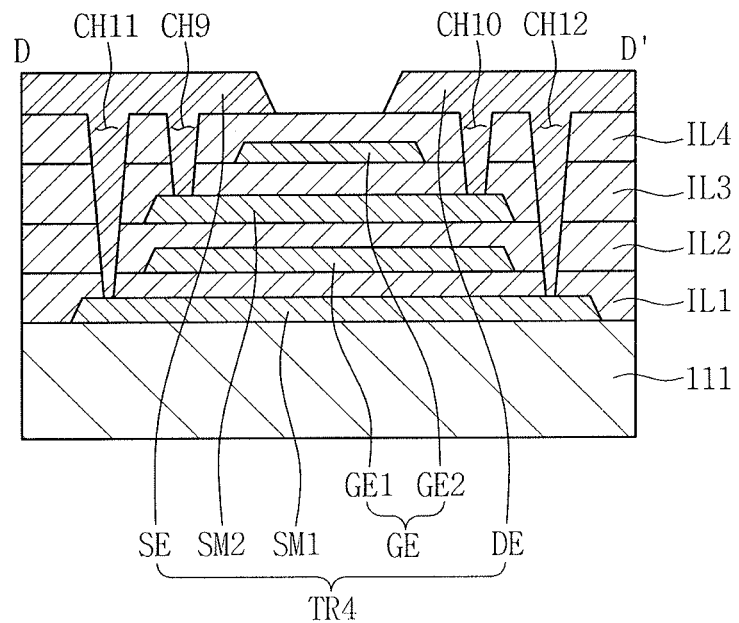
FIG. 7B illustrates a view taken along section line D-D' in FIG. 7A.

FIG. 7A illustrates an embodiment of a switching element TR4, and FIG. 7B illustrates a cross-sectional view taken along line D-D' of FIG. 7A. Referring to FIGS. 7A and 7B, a first semiconductor layer SM1 is on a substrate 111, a first insulating layer IL1 is on the first semiconductor layer SM1, a first gate electrode GE1 is on the first insulating layer IL1, a second insulating layer IL2 is on the first gate electrode GE1, a second semiconductor layer SM2 is on the second insulating layer IL2, a third insulating layer IL3 is on the second semiconductor layer SM2, a second gate electrode GE2 is on the third insulating layer IL3, a fourth insulating layer IL4 is on the second gate electrode GE2, and a source electrode SE and a drain electrode DE are on the fourth insulating layer IL4.

In such an exemplary embodiment, the source electrode SE and drain electrode DE are connected to the second semiconductor layer SM2 through respective contact holes CH9 and CH10 through the fourth insulating layer IL4 and the third insulating layer IL3. The source electrode SE and the drain electrode DE are connected to the first semiconductor layer SM1 through respective contact holes CH11 and CH12 through the fourth insulating layer IL4, the third insulating layer IL3, the second insulating layer IL2, and the first insulating layer IL1.

Figure 8:
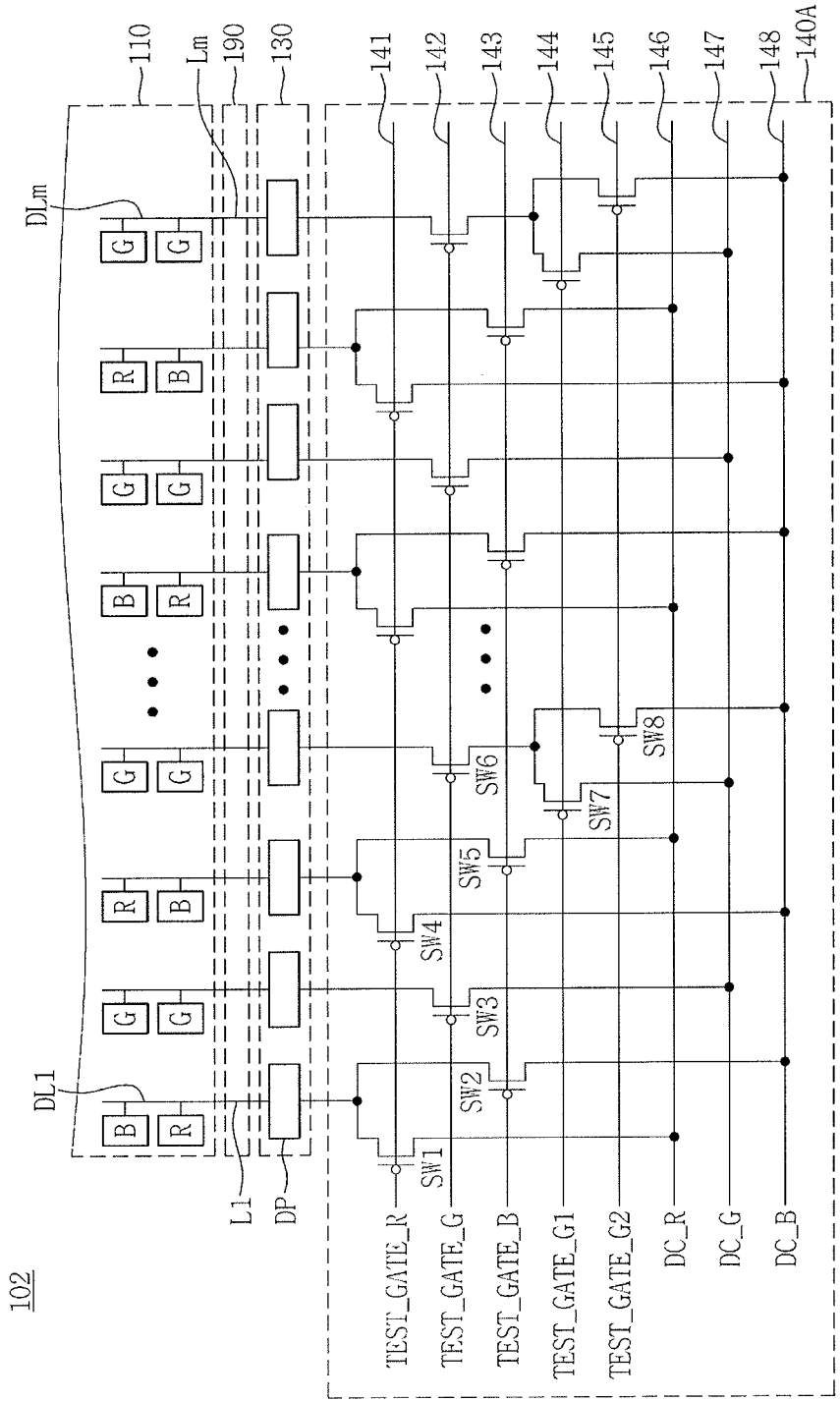
FIG. 8 illustrates another embodiment of wiring in a display device.

FIG. 8 illustrates a wiring embodiment of a display device 102, which includes a first test unit 140A for selectively performing a lighting test and a link line test.

Referring to FIG. 8, a pixel portion 110 includes first pixels, second pixels, and third pixels that emit light of different colors. The first and second pixels are alternately arranged in substantially a same column. The third pixels may be arranged in a line in a column adjacent to the column in which the first and second pixels are arranged.

In the display device 102 in FIG. 8, the first pixel is a red pixel R emitting a red light, the second pixel is a blue pixel B emitting a blue light, and the third pixel is a green pixel G emitting a green light. The red pixel R and the blue pixel B are alternately arranged in substantially a same column. The green pixels G are arranged in a line in a column adjacent to the column in which the red pixel R and blue pixel B are arranged.

In such an exemplary embodiment, the red pixels R are arranged in a diagonal direction from each other and the blue pixels B are arranged in a diagonal direction from each other. These arrangements form a checkerboard pattern with respect to the column in which the green pixels G are arranged. Data lines DL1 to DLm are arranged in respective columns.

In one embodiment, red pixels R and blue pixels B may be alternately arranged in a first column, green pixels G may be arranged in a second column, red pixels R and blue pixel B may be arranged in a third column in the opposite order to the order of the first column, and green pixels G may be arranged in a fourth column. The first, second, third, and fourth columns may be repeatedly arranged in the pixel portion 110.

In this embodiment, the pixel portion 110 includes red pixels R, blue pixels B, and green pixels G. The pixel portion 110 may include pixels for displaying a different combination of colors in another embodiment.

A plurality of data pads DP are connected to link lines L1 to Lm, extend from the data lines DL1 to DLm, and are in an IC mounting area 130.

The first test unit 140A includes a plurality of test switches SW1, SW2, SW3, SW4, SW5, SW6, SW7 and SW8 that operate as a switching element TR. In such an exemplary embodiment, one of the switching elements TR1, TR2, TR3 or TR4 in FIGS. 4A, 4B, 5A, 5B, 6A, 6B, 7A and 7B may be used as each of the test switches SW1, SW2, SW3, SW4, SW5, SW6, SW7 and SW8.

A gate electrode GE of each of the test switches SW1, SW2, SW3, SW4, SW5, SW6, SW7 and SW8 may be connected to one of a plurality of test control lines 141, 142, 143, 144 and 145 for applying a test control signal. A source electrode SE thereof may be connected to one of a plurality of test signal lines 146, 147 and 148 for applying a pixel test signal or a link line test signal. A drain electrode DE thereof may be connected to one of the link lines L1 to Lm through a data pad DP.

For example, a gate electrode GE of a first test switch SW1 may be connected to a first test control line 141 for applying a first test control signal TEST_GATE_R, a drain electrode DE thereof may be connected to a data line D1, D5, ... in a first column through a data pad DP, and a source electrode SE thereof may be connected to a first test signal line 146 applying a first test signal DC_R. The first test signal DC_R may be a first pixel test signal or a first link line test signal.

A gate electrode GE of a second test switch SW2 may be connected to a second test control line 143 for applying a second test control signal TEST_GATE_B, a drain electrode DE thereof may be connected to the data line D1, D5, . . . in the first column through the data pad DP, and a source electrode SE thereof may be connected to a second test signal line 148 for applying a second test signal DC_B. The second test signal DC_B may be a second pixel test signal or a second link line test signal.

A gate electrode GE of a third test switch SW3 may be connected to a third test control line 142 for applying a third test control signal TEST_GATE_G, a drain electrode DE thereof may be connected to a data line D2, D6, . . . in a second column through a data pad DP, and a source electrode SE thereof may be connected to a third test signal line 147 for applying a third test signal DC_G. The third test signal DC_G may be a third pixel test signal or a third link line test signal.

A gate electrode GE of a fourth test switch SW4 may be connected to the first test control line 141 for applying the first test control signal TEST_GATE_R, a drain electrode DE thereof may be connected to a data line D3, D7, . . . in a third column through a data pad DP, and a source electrode SE thereof may be connected to the second test signal line 148 for applying the second test signal DC_B.

A gate electrode GE of a fifth test switch SW5 may be connected to the second test control line 143 for applying the second test control signal TEST_GATE_B, a drain electrode DE thereof may be connected to the data line D3, D7, . . . in the third column through the data pad DP, and a source electrode SE thereof may be connected to the first test signal line 146 for applying the first test signal DC_R.

A gate electrode GE of a sixth test switch SW6 may be connected to the third test control line 142 for applying the third test control signal TEST_GATE_G, a drain electrode DE thereof may be connected to a data line D4, D8, . . . in a fourth column through a data pad DP, and a source electrode SE thereof may be connected to a drain electrode DE of a seventh test switch SW7 and a drain electrode DE of an eighth test switch SW8.

A gate electrode GE of the seventh test switch SW7 may be connected to a fourth test control line 144 for applying a fourth test control signal TEST_GATE_G1, the drain electrode DE thereof may be connected to the source electrode SE of the sixth test switch SW6, and a source electrode SE thereof may be connected to the third test signal line 147 for applying the third test signal DC_G. The seventh test switch SW7 is in a turned on state during a lighting test and in a turned off state during a link line test.

A gate electrode GE of the eighth test switch SW8 may be connected to a fifth test control line 145 for applying a fifth test control signal TEST_GATE_G2, the drain electrode DE thereof may be connected to the source electrode SE of the sixth test switch SW6, and a source electrode SE thereof may be connected to the second test signal line 148 for applying the second test signal DC_B. The eighth test switch SW8 is in a turned off state during a lighting test and in a turned on state during a link line test.

The seventh test switch SW7 and eighth test switch SW8 may be selectively turned on during the lighting test and link test so that a corresponding test signal may be applied.

The first, second, third, fourth and fifth test control lines 141, 142, 143, 144 and 145 receive, from the pad unit 180, control signals TEST_GATE_R, TEST_GATE_B, TEST_GATE_G, TEST_GATE_G1, and TEST_GATE_G2 having a gate-on level or a gate-off level during the lighting test and the link line test. The control signals control turn-on and turn-off states of the first, second, third, fourth, fifth, sixth, seventh and eighth switches SW1, SW2, SW3, SW4, SW5, SW6, SW7 and SW8.

The first, second and third test signal lines 146, 147 and 148 receive the first, second, and third pixel test signals from the pad unit 180 during a lighting test, and receive the first, second, and third link line test signals from the pad unit 180 during a link line test.

The test switches SW1, SW2, SW3, SW4, SW5, SW6, SW7 and SW8 may be implemented by any of the switching elements TR1, TR2, TR3 and TR4 in FIGS. 4A, 4B, 5A, 5B, 6A, 6B, 7A and 7B. The test switches SW1, SW2, SW3, SW4, SW5, SW6, SW7 and SW8 include an oxide semiconductor layer and a silicon-based semiconductor layer. The test switches SW1, SW2, SW3, SW4, SW5, SW6, SW7 and SW8 may have the characteristics of both of a silicon-based semiconductor and an oxide semiconductor. The switches may therefore may have excellent electrical characteristics and high signal transmission rate. As a result of excellent switching characteristics, the switching elements may be arranged at high density in a narrow area, even when the semiconductor layers SM1 and SM2 have narrow width.

Figure 9:
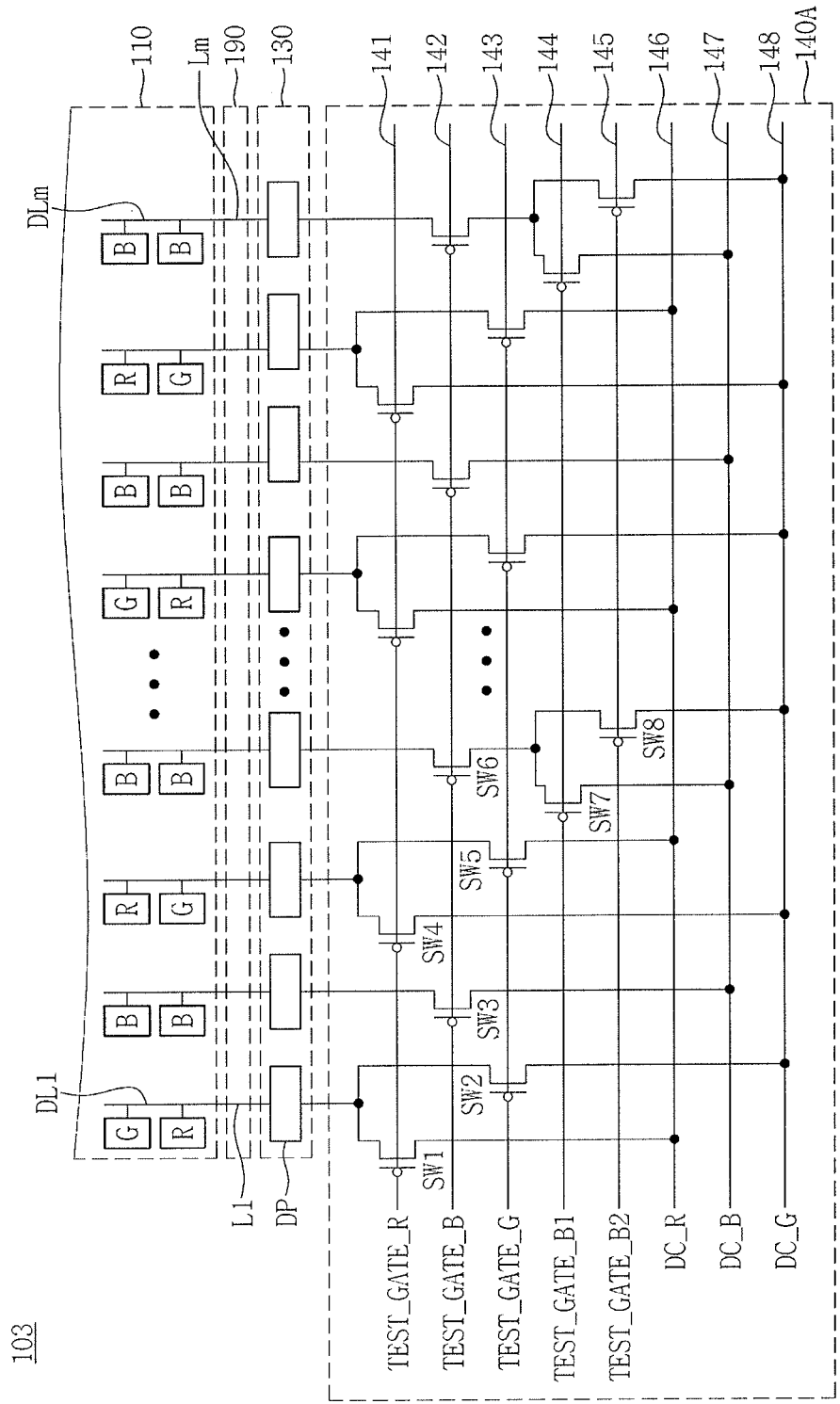
FIG. 9 illustrates another embodiment of wiring in a display device.

FIG. 9 illustrates a wiring embodiment of a display device 103, which includes a first test unit 140A for selectively performing a lighting test and a link line test. A pixel portion 110 in FIG. 9 includes first pixels, second pixels, and third pixels that emit light of different colors. The first pixel and the second pixel are alternately arranged in a substantially same column. The third pixels are arranged in a line in a column adjacent to the column in which the first pixel and the second pixel are arranged.

In the display device 103 in FIG. 9, the first pixels are red pixels R emitting red light, the second pixels are green pixels G emitting green light, and the third pixel are blue pixels B emitting blue light. The red pixels R and green pixels G are alternately arranged in a substantially same column. The blue pixels B are arranged in a line in a column adjacent to the column in which the red pixel R and green pixel G are arranged.

In such an exemplary embodiment, the red pixels R are arranged in a diagonal direction and the green pixels G are arranged in a diagonal direction. These arrangements, therefore, form a checkerboard pattern with respect to the columns in which the blue pixels B are arranged. Data lines DL1 to DLm are in respective columns.

For example, red pixels R and green pixels G may be alternately arranged in a first column, blue pixels B may be arranged in a second column, red pixels R and green pixels G may be arranged in a third column in the opposite order to the order of the first column, and blue pixels B may be arranged in a fourth column. These arrangements may be repeated in the pixel portion 110.

The pixel unit 110 is described as including red pixels R, blue pixels B, and green pixels G in FIG. 9. The pixel unit 110 may include pixels that emit light of a different combination of colors in an other embodiment.

A plurality of data pads DP are connected to link lines L1 to Lm, extend from the data lines DL1 to DLm, and are in an IC mounting area 130.

The first test unit 140A includes a plurality of test switches SW1, SW2, SW3, SW4, SW5, SW6, SW7 and SW8 that operate as a switching element TR. Any one of the switching elements TR1, TR2, TR3 and TR4 in FIGS. 4A, 4B, 5A, 5B, 6A, 6B, 7A, and 7B may be used as the test switches SW1, SW2, SW3, SW4, SW5, SW6, SW7 and SW8.

A gate electrode GE of each of the test switches SW1, SW2, SW3, SW4, SW5, SW6, SW7 and SW8 may be connected to one of a plurality of test control lines 141, 142, 143, 144 and 145 for applying a test control signal, a source electrode SE thereof may be connected to one of a plurality of test signal lines 146, 147 and 148 for applying a pixel test signal or a link line test signal, and a drain electrode DE thereof may be connected to one of the link lines L1 to Lm through a data pad DP.

For example, a gate electrode GE of a first test switch SW1 may be connected to a first test control line 141 for applying a first test control signal TEST_GATE_R, a drain electrode DE thereof may be connected to a data line D1, D5, . . . in a first column through a data pad DP, and a source electrode SE thereof may be connected to a first test signal line 146 for applying a first test signal DC_R. The first test signal DC_R may be a first pixel test signal or a first link line test signal.

A gate electrode GE of a second test switch SW2 may be connected to a second test control line 143 for applying a second test control signal TEST_GATE_G, a drain electrode DE thereof may be connected to the data line D1, D5, . . . in the first column through the data pad DP, and a source electrode SE thereof may be connected to a second test signal line 148 for applying a second test signal DC_G. The second test signal DC_G may be a second pixel test signal or a second link line test signal.

A gate electrode GE of a third test switch SW3 may be connected to a third test control line 142 for applying a third test control signal TEST_GATE_B, a drain electrode DE thereof may be connected to a data line D2, D6, . . . in a second column through a data pad DP, and a source electrode SE thereof may be connected to a third test signal line 147 for applying a third test signal DC_B. The third test signal DC_B may be a third pixel test signal or a third link line test signal.

A gate electrode GE of a fourth test switch SW4 may be connected to the first test control line 141 for applying the first test control signal TEST_GATE_R, a drain electrode DE thereof may be connected to a data line D3, D7, . . . in a third column through a data pad DP, and a source electrode SE thereof may be connected to the second test signal line 148 for applying the second test signal DC_G.

A gate electrode GE of a fifth test switch SW5 may be connected to the second test control line 143 for applying the second test control signal TEST_GATE_G, a drain electrode DE thereof may be connected to the data line D3, D7, . . . in the third column through the data pad DP, and a source electrode SE thereof may be connected to the first test signal line 146 for applying the first test signal DC_R.

A gate electrode GE of a sixth test switch SW6 may be connected to the third test control line 142 for applying the third test control signal TEST_GATE_B, a drain electrode DE thereof may be connected to a data line D4, D8, . . . in a fourth column through a data pad DP, and a source electrode SE thereof may be connected to a drain electrode DE of a seventh test switch SW7 and a drain electrode DE of an eighth test switch SW8.

A gate electrode GE of the seventh test switch SW7 may be connected to a fourth test control line 144 for applying a fourth test control signal TEST_GATE_B1, the drain electrode DE thereof may be connected to the source electrode SE of the sixth test switch SW6, and a source electrode SE thereof may be connected to the third test signal line 147 for applying the third test signal DC_B. The seventh test switch SW7 is in a turned on state during a lighting test and in a turned off state during a link line test.

A gate electrode GE of the eighth test switch SW8 may be connected to a fifth test control line 145 for applying a fifth test control signal TEST_GATE_B2, the drain electrode DE thereof may be connected to the source electrode SE of the sixth test switch SW6, and a source electrode SE thereof may be connected to the second test signal line 148 for applying the second test signal DC_G. The eighth test switch SW8 is in a turned off state during a lighting test and in a turned on state during a link line test.

The seventh test switch SW7 and the eighth test switch SW8 may be selectively turned on during the lighting test and the link test so that a corresponding test signal may be applied.

The first, second, third, fourth and fifth test control lines 141, 142, 143, 144 and 145 receive, from the pad unit 180, control signals TEST_GATE_R, TEST_GATE_G, TEST_GATE_B, TEST_GATE_B1, and TEST_GATE_B2 having a gate-on level or a gate-off level during the lighting test and the link line test. These control signals control turn-on and turn-off states of the first, second, third, fourth, fifth, sixth, seventh and eighth switches SW1, SW2, SW3, SW4, SW5, SW6, SW7 and SW8.

The first, second and third test signal lines 146, 147 and 148 receive, from the pad unit 180, the first, second, and third pixel test signals during a lighting test, and receive, from the pad unit 180, the first, second, and third link line test signals during a link line test.

Any one of the switching elements TR1, TR2, TR3 and TR4 in FIGS. 4A, 4B, 5A, 5B, 6A, 6B, 7A and 7B may be used as each of the test switches SW1, SW2, SW3, SW4, SW5, SW6, SW7 and SW8. The test switches SW1, SW2, SW3, SW4, SW5, SW6, SW7 and SW8 may include an oxide semiconductor layer and a silicon-based semiconductor layer. The test switches SW1, SW2, SW3, SW4, SW5, SW6, SW7 and SW8 may have the characteristics of both a silicon-based semiconductor and an oxide semiconductor, and thus may have excellent electrical characteristics and a high signal transmission rate.

Because the switching elements have excellent switching characteristics, the switching elements may be arranged at a high density in a narrow area, even when the semiconductor layers SM1 and SM2 have a narrow width.

Figure 10:
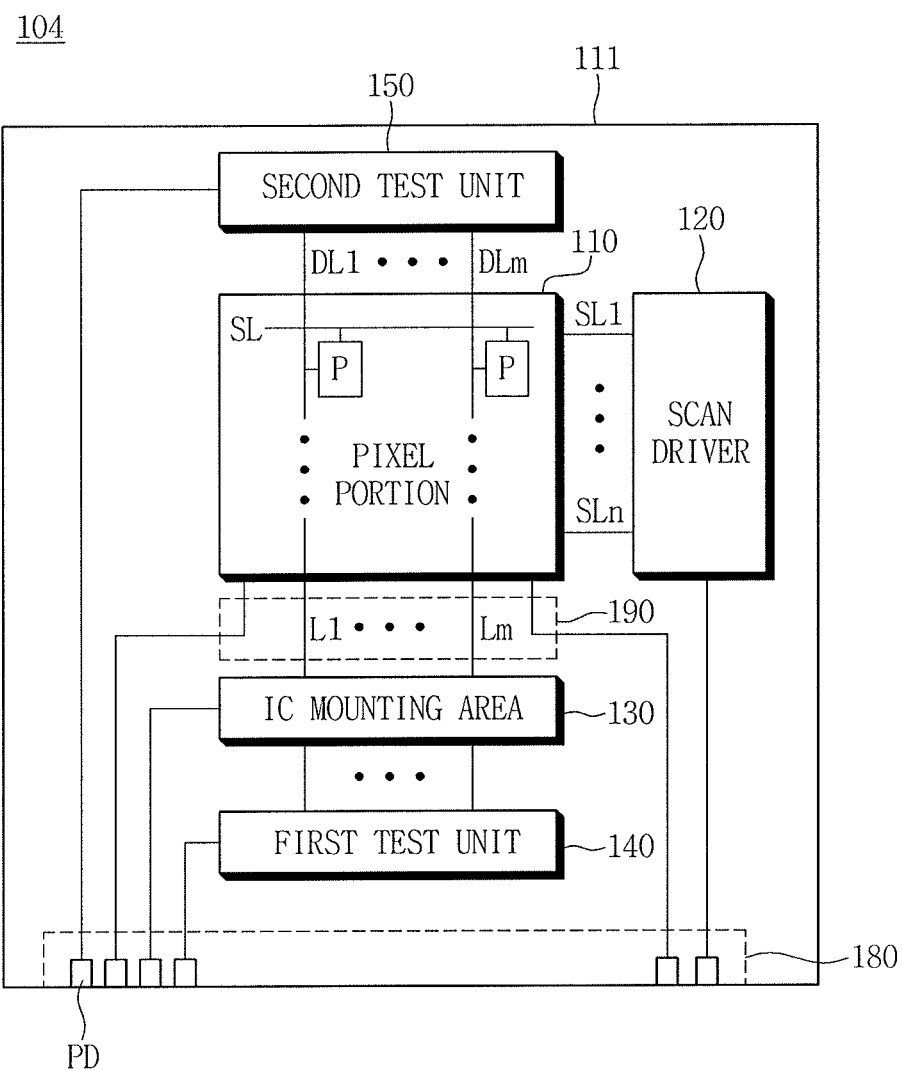
FIG. 10 illustrates another embodiment of a display device.
Figure 11:
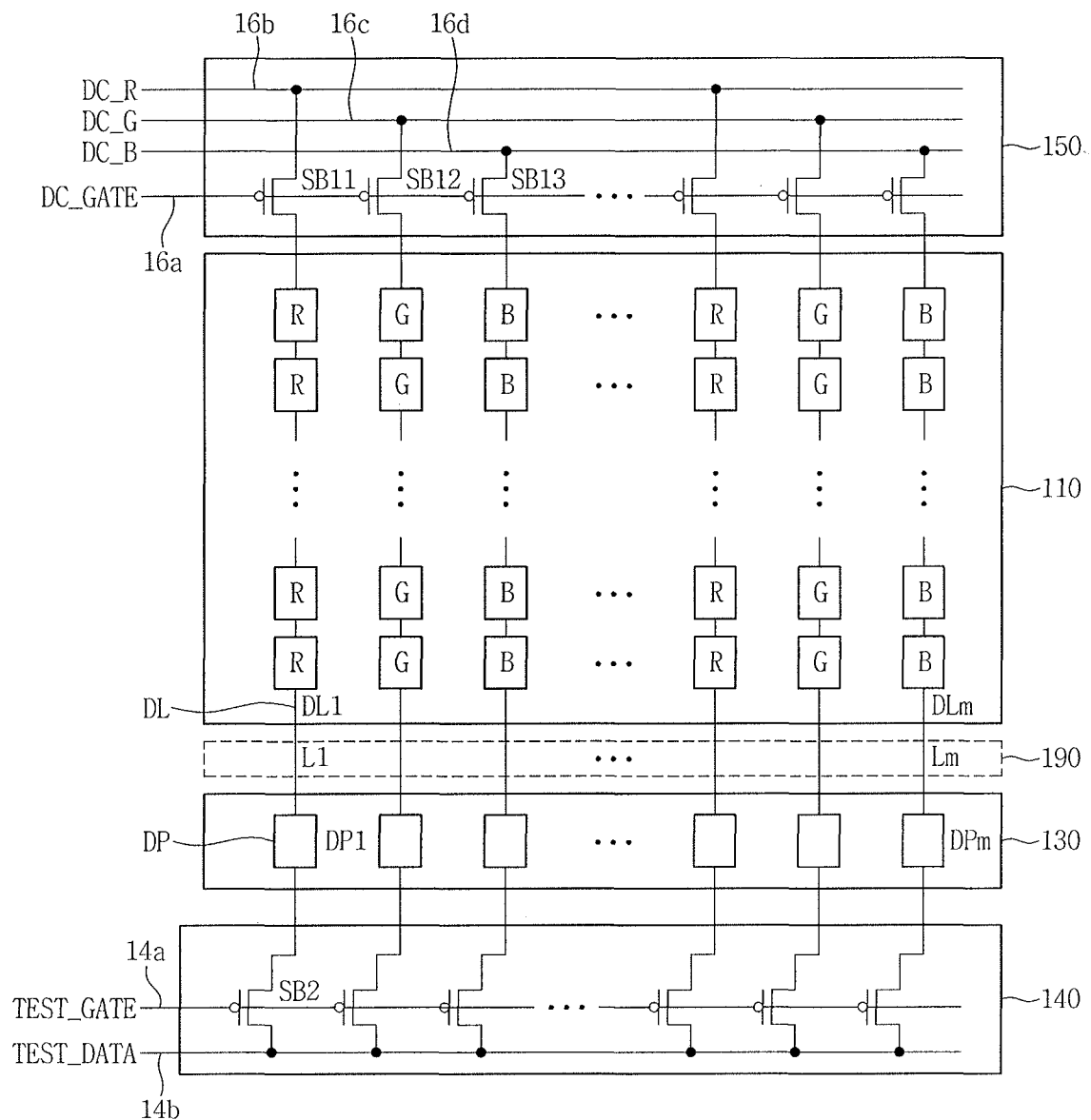
FIG. 11 illustrates an embodiment of wiring in the display device of FIG. 10.

FIG. 10 illustrates an embodiment of display device 104, and FIG. 11 illustrates a wiring embodiment of the display device 104. The display device 104 in further includes a second test unit 150 compared to the display device 101 in FIG. 2.

Referring to FIG. 11, a pixel portion 110 on a substrate 111 includes red pixels R, green pixels G, and blue pixels B. The second test unit 150 of the display device 103 according to FIG. 11 may initialize a wiring test and carry out a lighting test. Data pads DP1 to DPm are connected to link lines L1 to Lm, extend from first ends of data lines DL1 to DL, and are in an IC mounting area 130.

The second test unit 150 may include first initialization switches SB11, second initialization switches SB12, and third initialization switches SB13 connected to respective second ends of the data lines DL1 through DLm. Any one of the switching elements TR1, TR2, TR3 and TR4 in FIGS. 4A, 4B, 5A, 5B, 6A, 6B, 7A and 7B may be used the initialization switches SB11, SB12, and SB13. For example, the initialization switches SB11, SB12, and SB13 include an oxide semiconductor layer and a silicon-based semiconductor layer. Such initialization switches SB11, SB12, and SB13 may have characteristics of both a silicon-based semiconductor and an oxide semiconductor, and thus may have excellent electrical characteristics and a high signal transmission rate.

A gate electrode GE of each of the first, second, and third initialization switches SB11, SB12, and SB13 is connected to a test control line 16a for applying an initialization test control signal DC_GATE. A source electrode SE of the first initialization switch SB11 is connected to a first test signal line 16b applying a first initialization test signal DC_R and a drain electrode DE thereof is connected to a data line in a column in which a red pixel R is disposed. A source electrode SE of the second initialization switch SB12 is connected to a second test signal line 16c for applying a second initialization test signal DC_G and a drain electrode DE is connected to a data line in a column in which a green pixel G is disposed. A source electrode SE of the third initialization switch SB13 is connected to a third test signal line 16d for applying a third initialization test signal DC_B and a drain electrode DE thereof is connected to a data line in a column in which a blue pixel B is disposed.

The first test unit 140 may include second switches SB2 between the data pads DP of the IC mounting area 130 and a test signal line 14b. A gate electrode GE of the second switch SB2 is connected to a test control line 14a for applying a test control signal TEST_GATE. A source electrode SE of the second switch SB2 is connected to the test signal line 14b for applying a test signal TEST_DATA and a drain electrode DE thereof is connected to one of the data pads DP1 to DPm.

Any one of the switching elements TR1, TR2, TR3 and TR4 in FIGS. 4A, 4B, 5A, 5B, 6A, 6B, 7A, and 7B may also be used as the second switch SB2. Second switch SB2 may include an oxide semiconductor layer and a silicon-based semiconductor layer. Such a second switch SB2 have the characteristics of both a silicon-based semiconductor and an oxide semiconductor, and thus may have excellent electrical characteristics and a high signal transmission rate.

Figure 12:
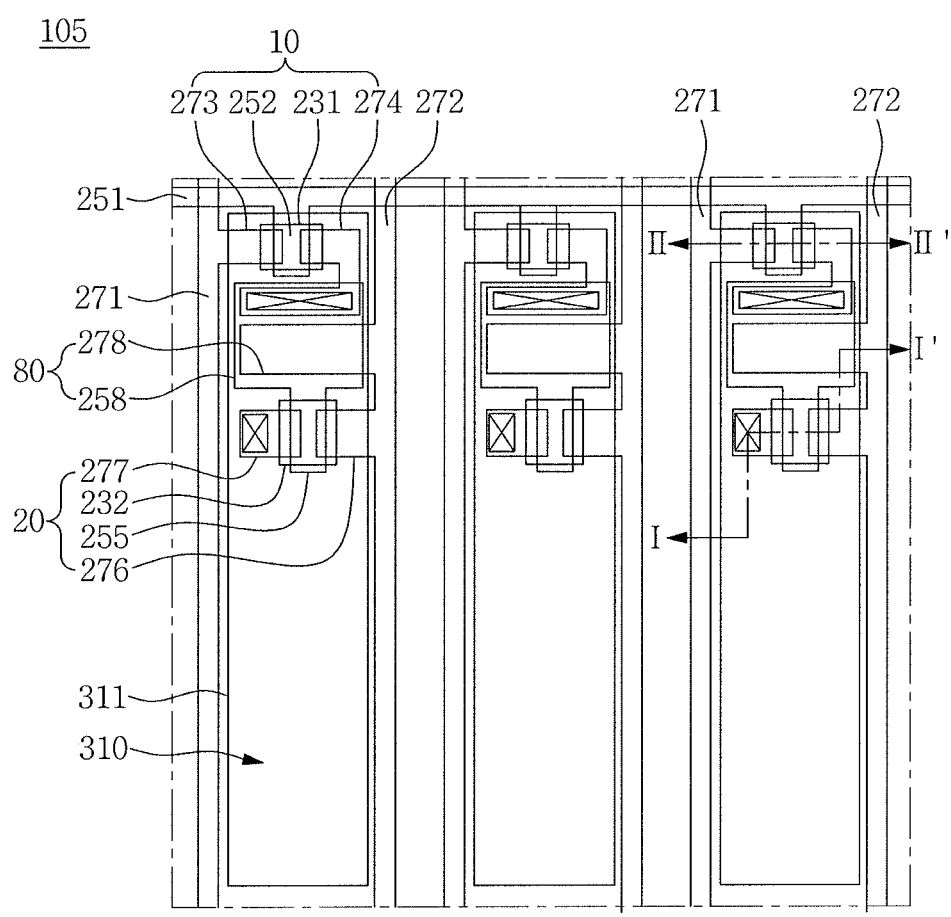
FIG. 12 illustrates an embodiment of a pixel of an organic light emitting diode.
Figure 13:
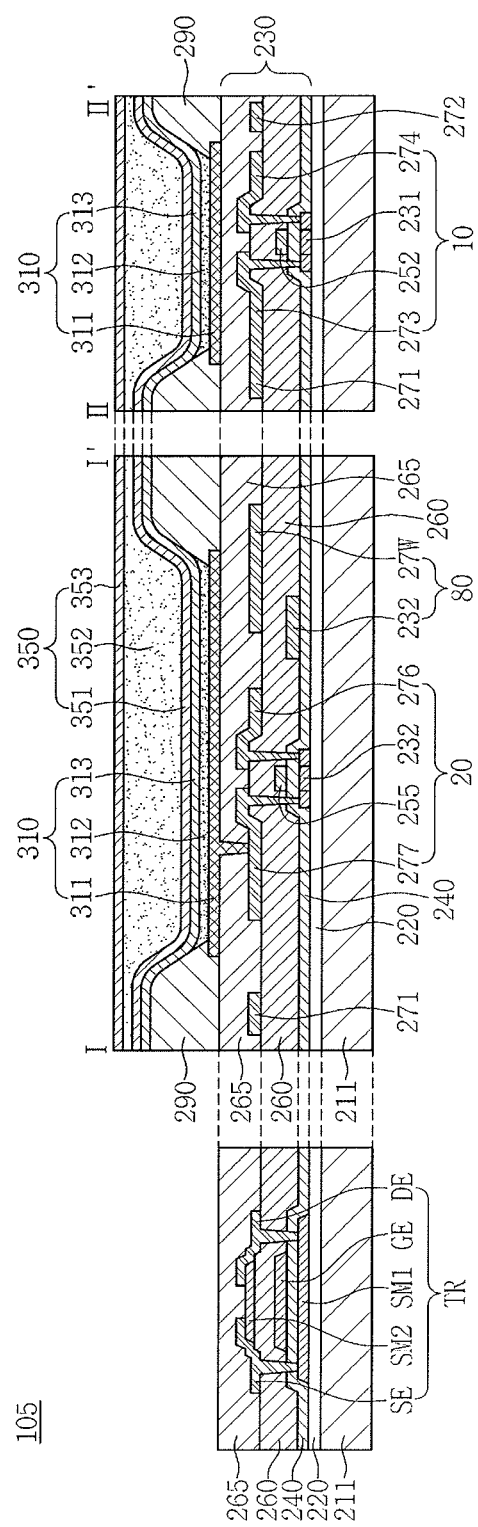
FIG. 13 illustrates a views taken along section line I-I' and II-II' in FIG. 12 and a cross-sectional view of a switching element according to one embodiment.

FIG. 12 illustrating another embodiment of a pixel of an organic light emitting diode (OLED) display device 105. FIG. 13 illustrates a cross-sectional views taken along line I-I' and II-II' of FIG. 12 and a cross-sectional view of a switching element TR.

The OLED display device 105 includes a substrate 211, a wiring unit 230, and an OLED 310. The substrate 211 may include an insulating material selected from the group consisting of; glass, quartz, ceramic, plastic, or the like. In an alternative exemplary embodiment, a polymer film may be used as the substrate 211.

A buffer layer 220 is on the substrate 211. The buffer layer 220 may include one or more layers selected from various inorganic layers and organic layers. In one embodiment, the buffer layer 220 may be omitted.

The wiring unit 230 is on the buffer layer 220 and includes a plurality of TFTs 10 and 20 for driving the OLED 310. For example, the OLED 310 emits light according to a driving signal from the wiring unit 230 to display an image.

The switching element TR of a test unit is on substantially a same layer as a layer on which the wiring unit 230 is disposed (e.g., see FIG. 13). Any one of the switching elements TR1, TR2, TR3 and TR4 in FIGS. 4A, 4B, 5A, 5B, 6A, 6B, 7A and 7B may be used as the switching element TR. Referring to FIG. 13, the switching element TR may have substantially the same stack structure as that of the switching element TR1 in FIGS. 4A and 4B.

FIGS. 12 and 13 illustrate an embodiment of an active matrix-type organic light emitting diode (AMOLED) display device having a 2Tr-1Cap structure. For example, the 2Tr-1Cap structure may include two TFTs, e.g., a switching TFT 10 and a driving TFT 20, and one capacitor 80 in each pixel, but the present exemplary embodiment is not limited thereto. For example, the OLED display device 105 may include three or more TFTs and two or more capacitors in each pixel, and may further include additional wirings. The term "pixel" may corresponds to a smallest unit for emitting light for displaying an image. The OLED display device 105 displays an image using a plurality of pixels.

Each pixel PX includes the switching TFT 10, the driving TFT 20, the capacitor 80, and the OLED 310. The wiring unit 230 may include a gate line 251 extending along at least one direction and a data line 271 and a common power line 272 may be insulated from and intersect the gate line 251. Each pixel PX may include the gate line 251, the data line 271, and the common power line 272 as a boundary. The pixels PX may be defined by a pixel defining layer or a black matrix.

The capacitor 80 includes a pair of capacitor plates 258 and 278, with an insulating interlayer 260 therebetween. In such an exemplary embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 includes a switching semiconductor layer 231, a switching gate electrode 252, a switching source electrode 273, and a switching drain electrode 274. The driving TFT 20 includes a driving semiconductor layer 232, a driving gate electrode 255, a driving source electrode 276, and a driving drain electrode 277. A gate insulating layer 240 is may insulate the semiconductor layers 231 and 232 and the gate electrodes 252 and 255.

The switching TFT 10 may function as a switching element which selects a pixel to perform light emission. The switching gate electrode 252 is connected to the gate line 251, and the switching source electrode 273 is connected to the data line 271. The switching drain electrode 274 is spaced apart from the switching source electrode 273 and connected to one of the capacitor plates, e.g., the capacitor plate 258.

The driving TFT 20 applies a driving power to a first electrode 311, which is a pixel electrode PE, in order to allow a light emitting layer 312 of the OLED 310 in a selected pixel to emit light. The driving gate electrode 255 is connected to capacitor plate 258 that is connected to the switching drain electrode 274. Each of the driving source electrode 276 and capacitor plate 278 is connected to the common power line 272. The driving drain electrode 277 is connected to the first electrode 311 of the OLED 310 through a contact hole in a planarization layer 265.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80. A current corresponding to the voltage stored in the capacitor 80 flows to the OLED 310 through the driving TFT 20 such that the OLED 310 may emit light.

Referring to FIG. 13, the driving source electrode 276 and the driving drain electrode 277 of the driving TFT 20 are on substantially a same layer as the source electrode SE and the drain electrode DE of the switching element TR at the test unit. The driving source electrode 276 and the driving drain electrode 277 and the source electrode SE and the drain electrode DE of the switching element TR may be formed by substantially a same process and may include substantially a same material.

Referring to FIG. 13, the switching source electrode 273 and the switching drain electrode 274 of the switching TFT 10 are also on substantially a same layer as the source electrode SE and the drain electrode DE of the switching element TR at the test unit. The switching source electrode 273 and the switching drain electrode 274 and the source electrode SE and the drain electrode DE of the switching element TR may also be formed by substantially a same process and may include substantially a same material.

Referring to FIG. 13, the driving gate electrode 255 and the switching gate electrode 252 may be on substantially a same layer as the gate electrode GE of the switching element TR. The driving gate electrode 255 and the switching gate electrode 252 and the gate electrode GE of the switching element TR may be formed by substantially a same process and may include substantially a same material.

The driving semiconductor layer 232 and the switching semiconductor layer 231 may be on substantially a same layer as one of a first semiconductor layer SM1 or a second semiconductor layer SM2 of the switching element TR.

Referring to FIG. 13, the driving semiconductor layer 232 and the switching semiconductor layer 231 are on substantially a same layer as the first semiconductor layer SM1 of the switching element TR. In such an exemplary embodiment, the driving semiconductor layer 232 and the switching semiconductor layer 231, and the first semiconductor layer SM1 of the switching element TR may be formed by substantially a same process and may include substantially a same material.

The driving semiconductor layer 232, the switching semiconductor layer 231, and the first semiconductor layer SM1 of the switching element TR may include, for example, an oxide semiconductor. In such an exemplary embodiment, the second semiconductor layer SM2 of the switching element TR may include a silicon-based semiconductor. Low-temperature polycrystalline silicon (LTPS) may be used as a silicon-based semiconductor. The driving semiconductor layer 232 and the switching semiconductor layer 231, and the second semiconductor layer SM2 of the switching element TR may be formed by substantially a same process and may include substantially a same material in one embodiment.

The OLED 310 includes the first electrode 311, the light emitting layer 312 on the first electrode 311, and a second electrode 313 on the light emitting layer 312. The light emitting layer 312 includes a low molecular organic material or a high molecular organic material. Holes and electrons are injected into the light emitting layer 312 from the first electrode 311 and the second electrode 313, respectively. The holes and electrons combine to form excitons. When the excitons change from an excited state to a ground state, the OLED 310 emits light.

Referring to FIG. 13, the first electrode 311 is an anode. The first electrode 311 may be a transmissive electrode having light transmittance or a reflective electrode having light reflectance. The second electrode 313 may be formed as a transflective layer or a reflective layer.

At least one of a hole injection layer HIL and a hole transporting layer HTL may be provided between the first electrode 311 and the light emitting layer 312. At least one of an electron transporting layer ETL or an electron injection layer EIL may be provided between the light emitting layer 312 and the second electrode 313. The light emitting layer 312, the hole injection layer HIL, the hole transporting layer HTL, the electron transporting layer ETL, and the electron injection layer EIL may include an organic material, and thus may be referred to as an organic layer.

A pixel defining layer 290 has an aperture exposing a portion of the first electrode 311. The light emitting layer 312 and second electrode 313 are sequentially stacked on the first electrode 311 at the aperture of the pixel defining layer 290. In such an exemplary embodiment, the second electrode 213 may be formed on the pixel defining layer 290 as well as on the light emitting layer 312. In addition, the HIL, HTL, ETL, and EIL may be between the pixel defining layer 290 and the second electrode 313. The OLED 310 emits light from the light emitting layer 312 through the aperture of the pixel defining layer 290. The pixel defining layer 290 thus defines a light emission area. A capping layer may be on the second electrode 313 to protect the OLED 310 from the external environment.

Referring to FIG. 13, a thin film encapsulating layer 350 is on the second electrode 313. The thin film encapsulation layer 350 includes one or more inorganic layers 351 and 353 and one or more organic layers 352 to prevent outside air, moisture, and oxygen from permeating into the OLED 310. The thin film encapsulation layer 350 may have a structure in which one or more inorganic layers 351 and 353 and one or more organic layers 352 are alternately stacked. In FIG. 12, the thin film encapsulation layer 350 includes two inorganic layers 351 and 353 and one organic layer 352, but the number of these layers may be different in another embodiment.

Each of the inorganic layers 351 and 353 may include one or more inorganic material of: $Al_2O_3$, $TiO_2$, ZrO, $SiO_2$, AlON, AlN, SiON, $Si_3N_4$, ZnO, and $Ta_2O_5$. The inorganic layers 351 and 353 may be formed through methods such as a chemical vapor deposition (CVD) method or an atomic layer deposition (ALD) method. The inorganic layers 351 and 353 may be formed using different methods in another embodiment.

The organic layer 352 may include a polymer-based material, e.g., an acrylic resin, an epoxy resin, polyimide, and/or polyethylene. The organic layer 352 may be formed, for example, through a thermal deposition process. The thermal deposition process for forming the organic layer 352 may be performed at a temperature range that may not damage the OLED 310. The organic layer 352 may be formed using different methods in an other embodiment.

The inorganic layers 351 and 353 have a high density of thin film and thus may prevent or efficiently reduce infiltration of, mostly, moisture or oxygen. Infiltration of moisture and oxygen into the OLED 310 may also be largely prevented by the inorganic layers 351 and 353.

Moisture and oxygen that have passed through the inorganic layers 351 and 353 may further be blocked by the organic layer 352 The organic layer 352 may have relatively low moisture-infiltration preventing efficacy compared to the inorganic layers 351 and 353. In one embodiment, the organic layer 352 may serve as a buffer layer to reduce stress among respective ones of the inorganic layers 351 and 353 and the organic layer 352, in addition to the moisture-infiltration preventing function. Further, since the organic layer 352 has planarization characteristics, an uppermost surface of the thin film encapsulation layer 350 may be planarized by the organic layer 352.

The thin film encapsulation layer 350 may have a thickness of, for example, about 10 μm or less. Accordingly, OLED display device 105 may also have a significantly small thickness. By applying the thin film encapsulation layer 350 in such a manner, the OLED display device 105 may have flexible characteristics. In one embodiment, an encapsulation substrate may be on the second electrode 313 in lieu of the thin film encapsulating layer 350.

Figure 14:
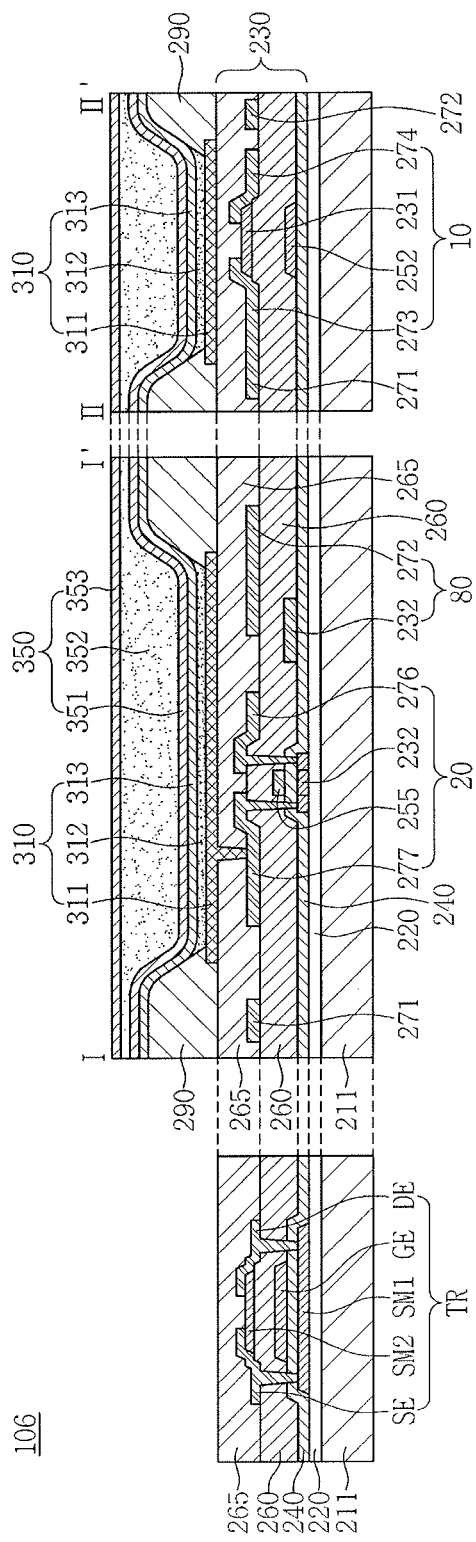
FIG. 14 illustrates another embodiment of a pixel and a switching element of an OLED display device.

FIG. 14 is a cross-sectional view illustrating an embodiment of a pixel and a switching element of an OLED display device 106. The OLED display device 106 includes a switching TFT 10 and a driving TFT 20 with different structures compared to those of the OLED display device 105 in FIG. 13.

Referring to FIG. 14, a driving source electrode 276, a driving drain electrode 277, a switching source electrode 273, and a switching drain electrode 274 are on substantially a same layer as a source electrode SE and a drain electrode DE of a switching element TR. The driving source electrode 276, the driving drain electrode 277, the switching source electrode 273, the switching drain electrode 274, the source electrode SE, and the drain electrode DE may be formed by substantially a same process and may include substantially a same material.

A switching gate electrode 252, a driving gate electrode 255, and a gate electrode GE of the switching element TR are on substantially a same layer. The driving gate electrode 255, the switching gate electrode 252, and the gate electrode GE of the switching element TR may be formed by substantially a same process and may include substantially a same material.

Referring to FIG. 14, the driving semiconductor layer 232 of the driving TFT 20 is on substantially a same layer as a first semiconductor layer SM1 of the switching element TR. The driving semiconductor layer 232 of the driving TFT 20 and the first semiconductor layer SM1 of the switching element TR may be formed by substantially a same process and may include substantially a same material.

In addition, the switching semiconductor layer 231 of the switching TFT 10 is on substantially a same layer as a second semiconductor layer SM2 of the switching element TR. The switching semiconductor layer 231 of the switching TFT 10 and the second semiconductor layer SM2 of switching element TR may be formed by substantially a same process and may include substantially a same material.

For example, the driving semiconductor layer 232 and the first semiconductor layer SM1 may include an oxide semiconductor, and the switching semiconductor layer 231 and the second semiconductor layer SM2 may include a silicon-based semiconductor. Conversely, the driving semiconductor layer 232 and the first semiconductor layer SM1 may include a silicon-based semiconductor, and the switching semiconductor layer 231 and the second semiconductor layer SM2 may include an oxide semiconductor. The silicon-based semiconductor may include, for example, low-temperature polycrystalline silicon (LTPS).

In one embodiment, the driving semiconductor layer 232 may be on substantially a same layer as the second semiconductor layer SM2 of the switching element TR. The switching semiconductor layer 231 may be on substantially a same layer as the first semiconductor layer SM1 of the switching element TR.

Figure 15:
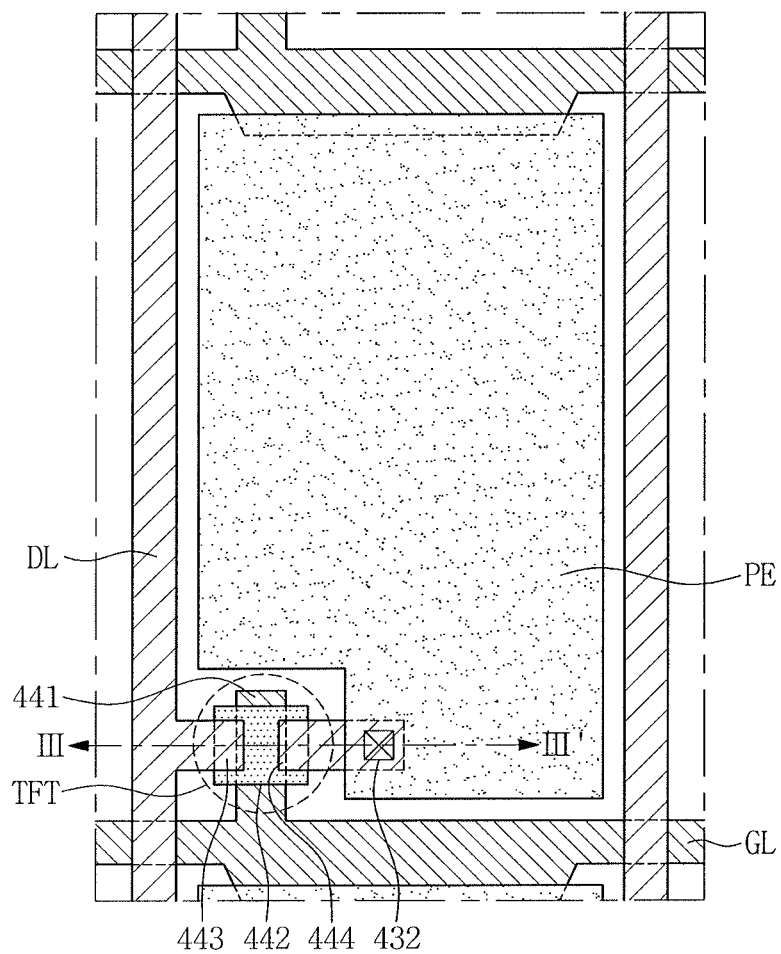
FIG. 15 illustrates an embodiment of a liquid crystal display device.
Figure 16:
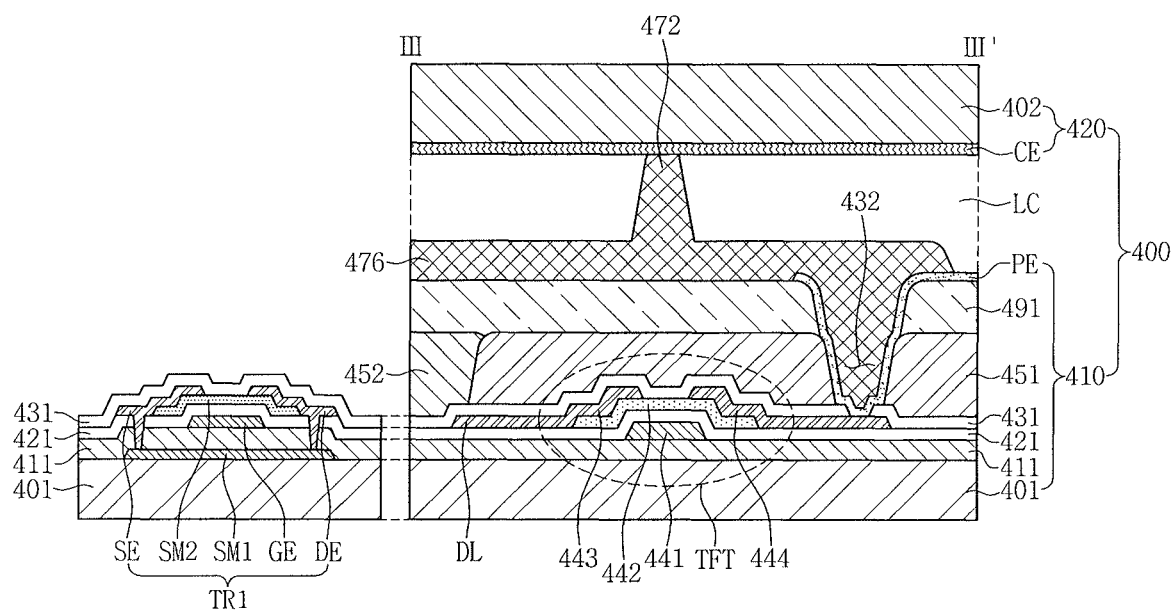
FIG. 16 illustrates a view taken along section line III-III' in FIG. 15 and a cross-sectional view illustrating a switching element according to one embodiment.

FIG. 15 illustrates an embodiment of a pixel of a liquid crystal display (LCD) device 107. FIG. 16 is a cross-sectional view taken along line III-III' of FIG. 15 and a cross-sectional view of a switching element TR.

Referring to FIG. 16, the LCD device 107 of FIG. 15 includes a display substrate 410, an opposing substrate 420, and a liquid crystal layer LC. The display substrate 410 includes a substrate 401, a first insulating layer 411 on the substrate 401, a gate line GL, a data line DL, a TFT, a gate insulating layer 421, an insulating interlayer 431, color filters 451 and 452, a planarization layer 491, and a pixel electrode PE.

A first semiconductor layer SM1 of the switching element TR is on the substrate 401 and the first insulating layer 411 is disposed thereon. A gate line GL and a gate electrode 441 extending from the gate line GL are on the first insulating layer 411. The gate line GL and the gate electrode 441 are on substantially a same layer. The gate line GL and the gate electrode 441 may include or be formed of one of: aluminum (Al) or alloys thereof, silver (Ag) or alloys thereof, copper (Cu) or alloys thereof, molybdenum (Mo) or alloys thereof, chromium (Cr), tantalum (Ta), and/or titanium (Ti). In addition, the gate line GL and the gate electrode 441 may have a multilayer structure including at least two conductive layers that have different physical properties.

The gate insulating layer 421 is on the gate line GL and the gate electrode 441. In such an exemplary embodiment, the gate insulating layer 421 may be over an entire surface of the substrate 401 including the gate line GL and the gate electrode 441. The gate insulating layer 421 may include silicon nitride ($SiN_x$) or silicon oxide ($SiO_x$). In addition, the gate insulating layer 421 may have a multilayer structure including at least two insulating layers having different physical properties.

The semiconductor layer 442 is on the gate insulating layer 421. In such an exemplary embodiment, the semiconductor layer 442 overlaps the gate electrode 441, the source electrode 443, and the drain electrode 444. The semiconductor layer 442 may include or be formed of amorphous silicon, polycrystalline silicon, or the like. The semiconductor layer 442 may include an oxide semiconductor material. An ohmic contact layer may be on the semiconductor layer 442.

The data line DL is on the gate insulating layer 421 and intersects the gate line GL. The source electrode 443 overlaps a portion of the semiconductor layer 442. The source electrode 443 extends from the data line DL. For example, in FIG. 13, the source electrode 443 has a shape protruding from the data line DL toward gate electrode 441.

The source electrode 443 may include or be formed of a refractory metal, such as molybdenum, chromium, tantalum, and titanium, or an alloy thereof. The source electrode 443 may have a multilayer structure including a refractory metal layer and a low-resistance conductive layer. Examples of the multilayer structure include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. The source electrode 443 may include or be formed of a different material in another embodiment.

The drain electrode 444 is spaced apart from the source electrode 443 and overlaps a portion of the semiconductor layer 442. The drain electrode 444 is connected to the pixel electrode PE. The drain electrode 444 and the source electrode 443 may be formed by substantially a same process and may include substantially a same material.

A TFT is defined by the gate electrode 441, the semiconductor layer 442, the source electrode 443, and the drain electrode 444. A channel area of the TFT is at a portion of the semiconductor layer 442 between the source electrode 443 and the drain electrode 444.

The switching element TR of a test unit may be disposed together with the TFT of the LCD device 107. Any of the switching elements TR1, TR2, TR3 and TR4 in FIGS. 4A, 4B, 5A, 5B, 6A, 6B, 7A, and 7B may be used as the switching element TR. Referring to FIG. 16, the switching element TR has substantially a same stack structure as the switching element TR1 in FIGS. 4A and 4B.

Referring to FIG. 16, the source electrode 443 and drain electrode 444 of the TFT are on substantially a same layer as a source electrode SE and a drain electrode DE of the switching element TR1 at the test unit. In addition, the source electrode 443 and the drain electrode 444 of the TFT and the source electrode SE and the drain electrode DE of the switching element TR1 may be formed by substantially a same process and may include substantially a same material.

Referring to FIG. 16, the gate electrode 441 of the TFT may be on substantially a same layer as a gate electrode GE of the switching element TR1. The gate electrode 441 of the TFT and the gate electrode GE of the switching element TR may be formed by substantially a same process and may include substantially a same material. In addition, the semiconductor layer 442 of the TFT may be on substantially a same layer as one of a first semiconductor layer SM1 or a second semiconductor layer SM2 of the switching element TR1.

Referring to FIG. 16, the semiconductor layer 442 of the TFT may be on substantially a same layer as the second semiconductor layer SM2 of the switching element TR1. In such an exemplary embodiment, the semiconductor layer 442 of the TFT and the second semiconductor layer SM2 of the switching element TR1 may be formed by substantially a same process and may include substantially a same material.

The insulating interlayer 431 is on the data line DL, the source electrode 443, the drain electrode 444, and the gate insulating layer 421. In such an exemplary embodiment, the insulating interlayer 431 may be over an entire surface of the substrate 401 including the data line DL, the source electrode 443, the drain electrode 444, and the gate insulating layer 421. Referring to FIGS. 15 and 16, insulating interlayer 431 has a drain contact hole 432, and drain electrode DE is exposed by the drain contact hole 432.

The insulating interlayer 431 may include an inorganic insulating material such as silicon nitride (SiNx) and silicon oxide (SiOx). In an alternative exemplary embodiment, the insulating interlayer 431 may include an organic layer. In an alternative exemplary embodiment, the insulating interlayer 431 may have a double-layer structure including a lower inorganic layer and an upper organic layer.

A first color filter 451 and a second color filter 452 are on the insulating interlayer 431. Edges of the first and second color filters 451 and 452 may be on the gate line GL, the TFT, and the data line DL. Edges of adjacent ones of first and second color filters 451 and 452 may overlap each other. Each of the color filters 451, 452 has an aperture on drain electrode 444. The first color filter 451 and the second color filter 452 filter light of different colors, e.g., red, green, blue, cyan, magenta, yellow, or white.

The LCD device 107 may further include a third color filter that filters light of a different color from the first color filter 451 and the second color filter 452, e.g., one of red, green, blue, cyan, magenta, and yellow. The color filters 451 and 452 may be on a sealing substrate 402.

The planarization layer 491 is on the color filters 451 and 452. The planarization layer 491 may be over an entire surface of the substrate 401 including the color filters 451 and 452 and the insulating interlayer 431. The planarization layer 491 may have an aperture defined corresponding to the drain contact hole 432.

The planarization layer 491 functions as a protective layer and serves to planarize a portion below the pixel electrode PE. The planarization layer 491 may serve as a protective layer. The planarization layer 491 may include an organic material, for example, a photosensitive organic material or a photosensitive resin composition. In such an embodiment, the planarization layer 491 may be an organic film.

The pixel electrode PE is connected to the drain electrode 444 through the drain contact hole 432. The pixel electrode PE is on the planarization layer 491. A portion of an edge of the pixel electrode PE may overlap a light blocking portion 476.

The light blocking portion 476 is on the pixel electrode PE and the planarization layer 491. For example, the light blocking portion 476 overlaps the TFT, the gate lines GL, and the data line DL to block light leakage.

A column spacer 472 may be on the light blocking portion 476. The column spacer 472 has a shape protruding from the light blocking portion 476 toward the opposing substrate 420 to a predetermined height. The column spacer 472 maintains a cell gap between the display substrate 410 and the opposing substrate 420.

The column spacer 472 and the opposing substrate 420 may have a unitary construction. In such an exemplary embodiment, the column spacer 472 and the light blocking portion 476 may be simultaneously formed and have substantially a same material. The column spacer 472 and the light blocking portion 476 may collectively serve as a black column spacer (BCS).

The opposing substrate 420 includes the sealing substrate 402 and a common electrode CE on the sealing substrate 402.

The liquid crystal layer LC is on the pixel electrode PE. For example, the liquid crystal layer LC is between the substrate 401 and the sealing substrate 402. For example, the liquid crystal layer LC may be in a space defined by the display substrate 410 and the opposing substrate 420. A panel including the display substrate 410, the liquid crystal layer LC, and the opposing substrate 420 may also be referred to as an LCD panel 400.

In accordance with one or more embodiments, the test unit includes a switching element that includes an oxide semiconductor layer and a silicon-based semiconductor layer. Accordingly, the test unit may have excellent electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:
1. A display device, comprising:
a substrate;
a pixel portion on the substrate and including a pixel connected to a data line;
a first test area including a test control line to transmit a test control signal, a test signal line to transmit a test signal, and a first switch, wherein the first switch includes:
a gate electrode connected to the test control line,
a first semiconductor layer and a second semiconductor layer overlapping the gate electrode and both turned on and off using the gate electrode;

a source electrode connected to the first semiconductor layer and the second semiconductor layer, the source electrode connected to the test signal line; and a drain electrode spaced apart from the source electrode and connected to the first semiconductor layer and the second semiconductor layer, wherein one of the first semiconductor layer or the second semiconductor layer includes an oxide semiconductor and the other of the first semiconductor layer or the second semiconductor layer includes a silicon-based semiconductor, and the pixel portion includes a switching thin film transistor including a third semiconductor layer and a driving thin film transistor including a fourth semiconductor layer, the one of the third semiconductor layer or the fourth semiconductor layer being on substantially a same layer as the first semiconductor layer.

2. The display device as claimed in claim 1, further comprising:

an insulating layer between the first semiconductor layer and the second semiconductor layer.

3. The display device as claimed in claim 2, wherein each of the source electrode and the drain electrode is connected to at least one of the first semiconductor layer or the second semiconductor layer through a contact hole in the insulating layer.

4. The display device as claimed in claim 1, wherein the gate electrode is between the first semiconductor layer and the second semiconductor layer.

5. The display device as claimed in claim 1, wherein the silicon-based semiconductor includes crystalline silicon.

6. The display device as claimed in claim 1, wherein the oxide semiconductor includes at least one of zinc oxide (ZnO), zinc-tin oxide (ZTO), zinc-indium oxide (ZIO), indium oxide (InO), titanium oxide (TiO), indium-gallium-zinc oxide (IGZO), or indium-zinc-tin oxide (IZTO).

7. The display device as claimed in claim 1, wherein the gate electrode includes a first gate electrode and a second gate electrode that overlap each other and that are spaced apart from each other.

8. The display device as claimed in claim 7, wherein at least one of the first gate electrode and the second gate electrode is between the first semiconductor layer and the second semiconductor layer.

9. The display device as claimed in claim 7, wherein the first semiconductor layer and the second semiconductor layer are between the first gate electrode and the second gate electrode.

10. The display device as claimed in claim 1, wherein the first test area is to detect resistive defects and short defects.

11. The display device as claimed in claim 1, wherein the first test area is to selectively perform a lighting test and a link line test.

12. The display device as claimed in claim 1, further comprising:

a second test area including a second switch connected to another end of the data line.

13. The display device as claimed in claim 12, wherein the second test area is to perform a lighting test.

14. The display device as claimed in claim 1, wherein the pixel portion includes an organic light emitting diode, the switching thin film transistor and the driving thin film transistor being connected to the organic light emitting diode.

15. The display device as claimed in claim 14, wherein each of the switching thin film transistor and the driving thin film transistor includes a gate electrode, a source electrode, and a drain electrode, and wherein the source electrode and the drain electrode of each of the switching thin film transistor and the driving thin film transistor are on substantially a same layer as the source electrode and the drain electrode of the first switch.

16. The display device as claimed in claim 15, wherein the gate electrode of each of the switching thin film transistor and the driving thin film transistor is on substantially a same layer as layer the gate electrode of the first switch.

17. A display device, comprising:

a substrate;

a pixel portion on the substrate and including a pixel connected to a data line;

a data pad mounting an IC and connected to one end of the data line; and a first test area including a test control line to transmit a test control signal, a test signal line to transmit a test signal, and a first switch connected to the data pad, the IC being between the pixel portion and first test area, wherein the first switch includes:

a gate electrode connected to the test control line, a first semiconductor layer and a second semiconductor layer overlapping the gate electrode and both turned on and off using the gate electrode;

a source electrode connected to the first semiconductor layer and the second semiconductor layer, the source electrode connected to the test signal line; and a drain electrode spaced apart from the source electrode and connected to the first semiconductor layer and the second semiconductor layer, the drain electrode connected to the data pad, wherein one of the first semiconductor layer or the second semiconductor layer includes an oxide semiconductor and the other of the first semiconductor layer or the second semiconductor layer includes a silicon-based semiconductor, and the pixel portion includes a switching thin film transistor including a third semiconductor layer and a driving thin film transistor including a fourth semiconductor layer, the one of the third semiconductor layer or the fourth semiconductor layer being on substantially a same layer as the first semiconductor layer.

18. The display device as claimed in claim 17, wherein the IC generates data signals, the data signals being applied to the data line.

19. The display device as claimed in claim 17, wherein each of the switching thin film transistor and the driving thin film transistor includes a gate electrode, a source electrode, and a drain electrode.

20. The display device as claimed in claim 19, wherein the source electrode of the switching thin film transistor is connected to the data line, and the gate electrode of the driving thin film transistor is connected to drain electrode.

* * * * *